United States Patent
Enomoto et al.

(10) Patent No.: US 10,781,276 B2
(45) Date of Patent: Sep. 22, 2020

(54) POLYMER, RESIST COMPOSITION CONTAINING POLYMER, AND METHOD FOR MANUFACTURING DEVICE USING SAME

(71) Applicant: TOYO GOSEI CO., LTD., Chiba (JP)

(72) Inventors: Satoshi Enomoto, Chiba (JP); Takumi Yoshino, Chiba (JP)

(73) Assignee: TOYO GOSEI CO., LTD., Chiba (JP)

( * ) Notice: Subject to any disclaimer, the term of this patent is extended or adjusted under 35 U.S.C. 154(b) by 227 days.

(21) Appl. No.: 15/763,600

(22) PCT Filed: Sep. 29, 2016

(86) PCT No.: PCT/JP2016/078761
§ 371 (c)(1),
(2) Date: Mar. 27, 2018

(87) PCT Pub. No.: WO2017/057537
PCT Pub. Date: Apr. 6, 2017

(65) Prior Publication Data
US 2018/0273664 A1    Sep. 27, 2018

(30) Foreign Application Priority Data
Oct. 1, 2015  (JP) ................. 2015-195863

(51) Int. Cl.
| C08F 220/30 | (2006.01) |
| C08F 220/38 | (2006.01) |
| G03F 7/039 | (2006.01) |
| G03F 7/004 | (2006.01) |
| C08F 220/34 | (2006.01) |
| G03F 7/038 | (2006.01) |
| G03F 7/031 | (2006.01) |

(52) U.S. Cl.
CPC .......... *C08F 220/30* (2013.01); *C08F 220/34* (2013.01); *C08F 220/38* (2013.01); *G03F 7/0045* (2013.01); *G03F 7/031* (2013.01); *G03F 7/038* (2013.01); *G03F 7/0397* (2013.01)

(58) Field of Classification Search
CPC .... C08F 220/30; C08F 220/38; C08F 220/34; C08F 212/22
USPC ................................. 522/904–905
See application file for complete search history.

(56) References Cited

U.S. PATENT DOCUMENTS

| 4,791,045 | A | * | 12/1988 | Mitra | ................. | C07D 295/108 |
| | | | | | | 430/281.1 |
| 4,954,416 | A | * | 9/1990 | Wright | ................. | C07C 381/12 |
| | | | | | | 430/281.1 |
| 5,968,713 | A | | 10/1999 | Nozaki et al. | | |
| 6,013,416 | A | | 1/2000 | Nozaki et al. | | |
| 6,200,725 | B1 | | 3/2001 | Takechi et al. | | |
| 2001/0003640 | A1 | | 6/2001 | Takechi et al. | | |
| 2006/0188790 | A1 | * | 8/2006 | Takizawa | ................ | G03F 7/001 |
| | | | | | | 430/1 |
| 2012/0202158 | A1 | | 8/2012 | Hatakeyama et al. | | |
| 2016/0147144 | A1 | | 5/2016 | Enomoto | | |
| 2016/0187773 | A1 | | 6/2016 | Enomoto | | |

FOREIGN PATENT DOCUMENTS

| EP | 0260877 A2 | * | 3/1988 | ............... C08F 2/50 |
| JP | H09-90637 A | | 4/1997 | |
| JP | H10-221852 A | | 8/1998 | |
| JP | 2007/316600 A | | 12/2007 | |
| JP | 2009-169406 A | | 7/2009 | |
| JP | 2012-181510 A | | 9/2012 | |
| WO | 2014/208102 A1 | | 12/2014 | |
| WO | 2015/019616 A1 | | 2/2015 | |

OTHER PUBLICATIONS

"Benzenoid", Hawleys Condensed Chemical Dictionary, first published Mar. 15, 2007 , https://doi.org/10.1002/9780470114735.hawley01674, one page ,obtained from Wiley Online Library. (Year: 2007).*
Parker , ed, "benzenoid" from McGraw-Hill Dlctioanry of Chemistry, International Edition, United States of America, The McGraw-Hill Company, 1997, p. 42. (Year: 1997).*
Katritzky, Alan R. Ramsden, Christopher A. Joule, John A. Zhdankin, Viktor V.. (2010). Handbook of Heterocyclic Chemistry (3rd Edition). (pp. 332). Elsevier. Retrieved from https://app.knovel.com/hotlink/toc/id:kpHHCE0002/handbookheterocyclic/handbook-heterocyclic p. 332. (Year: 2010).*
International Search Report dated Dec. 6, 2016 of corresponding International application No. PCT/JP2016/078761; 2 pgs.

* cited by examiner

*Primary Examiner* — Cynthia Hamilton
(74) *Attorney, Agent, or Firm* — Maier & Maier, PLLC

(57) ABSTRACT

An object of the present invention is to provide a polymer used for a resist composition having high absorption efficiency for a particle beam or an electromagnetic wave, and excellence in sensitivity, resolution and pattern performance characteristics, and provide a resist composition containing the polymer and a method of manufacturing a device using thereof.
The polymer comprises: a unit A; and a unit B, wherein the unit A has an onium salt structure and generates a first radical by irradiation with a particle beam or an electromagnetic wave, the unit B has a radical generating structure containing at least one multiple bond which is between a carbon atom and a carbon atom or between a carbon atom and a heteroatom, and generates a second radical by irradiation with a particle beam or an electromagnetic wave, and the multiple bond is not one contained in a benzenoid aromatic.

13 Claims, No Drawings

POLYMER, RESIST COMPOSITION CONTAINING POLYMER, AND METHOD FOR MANUFACTURING DEVICE USING SAME

TECHNICAL FIELD

Some aspects of the present invention relate to a polymer used for a resist composition. Some embodiments of the present invention relate to a resist composition comprising the polymer and a method of manufacturing a device using the resist composition.

BACKGROUND ART

In recent years, by making full use of a photolithography technique using a photoresist, manufacturing of a display device such as a liquid crystal display (LCD) and an organic EL display (OLED), and a formation of semiconductor elements are active. As an active energy ray, i-line having a wavelength of 365 nm, and light such as h-line (405 nm) and g-line (436 nm) having a longer wavelength than i-line are widely used for the packaging of the electronic component and the electronic product.

Since a device integration has developed, the demand for miniaturization of lithography technology has been increased, a light having a very short wavelength such as KrF excimer laser (wavelength 248 nm), ArF excimer laser (wavelength 193 nm), extreme ultraviolet (EUV, wavelength 13.5 nm) and an electron beam (EB) tends to be used for exposure. Since these lithography techniques using short wavelength light, especially EUV or electron beam, can allow manufacturing by single patterning, a demand for a resist composition having high sensitivity to EUV, the electron beam or the like may further increase in the future.

Due to shortening the wavelength of the exposure light source, it is required for the resist composition to improve the sensitivity to the exposure light source and the resolution property of lithography which can reproduce a pattern of fine dimensions. A chemically amplified resist is known as a resist composition satisfying such requirements (Patent Literature 1).

However, with conventional chemically amplified resists, it is difficult to sufficiently suppress reduction in resist pattern collapse and line edge roughness (LER) of a line pattern as resolution width of resist becomes finer. In order to suppress the resist pattern collapse, it has been proposed to increase a crosslinking density in a negative chemically amplified resist. However, swelling occurs during development and defects such as bridges may occur. Although it is strongly required to prevent the resist pattern collapse and the bridge formation, since conventional chemically amplified resist compositions for EUV, electron beam or the like have low EUV or electron beam absorption, it is difficult to simultaneously satisfy the required characteristics in sensitivity, resolution and pattern performance.

CITATION LIST

Patent Literature

Patent Literature 1: JPH9-90637

SUMMARY OF INVENTION

Technical Problem

An object of some aspects of the present invention is to provide a polymer used for a resist composition having high absorption efficiency for a particle beam or an electromagnetic wave, especially electron beam or EUV, and excellence in sensitivity, resolution and pattern performance characteristics.

An object of some aspects of the present invention is to provide a resist composition comprising the polymer and a method of manufacturing a device using the resist composition.

Solution to Problem

As a result of intensive investigation to solve the above problems, the inventors of the present invention found that when a polymer comprising a unit A having an onium salt structure and a unit B having a specific multiple bond is used as a polymer of a resist composition, an intramolecular crosslinking reaction occurs between the unit A and the unit B by irradiation with a particle beam, an electromagnetic wave or the like, so that high sensitivity can be achieved and pattern collapse can be suppressed. Then, the inventors completed some aspects of the present invention.

One aspect of the present invention to solve the above problems is a polymer, comprising: a unit A; and a unit B, wherein the unit A has an onium salt structure and generates a first radical by irradiation with a particle beam or an electromagnetic wave, the unit B has a radical generating structure containing at least one multiple bond selected from the group consisting of: a multiple bond between a carbon atom and a carbon atom; a multiple bond between a carbon atom and a heteroatom, and generates a second radical by irradiation with a particle beam or an electromagnetic wave, and the multiple bond in the radical generating structure is not a multiple bond contained in a benzenoid aromatic.

An embodiment of the present invention is a resist composition comprising the polymer.

Moreover, an embodiment of the present invention is a method of manufacturing a device, comprising: a resist film forming step of forming the resist film on a substrate using the resist composition; a photolithography step of exposing the resist film to the particle beam or the electromagnetic wave; and a pattern forming step of developing the exposed resist film to obtain a photoresist pattern.

Advantageous Effects of Invention

A polymer of some aspects of the present invention has high absorption efficiency for the particle beam, the electromagnetic wave or the like, and is excellent in sensitivity, resolution and pattern performance characteristics when the polymer is used for the resist composition.

DESCRIPTION OF EMBODIMENTS

In the present invention, "a particle beam or an electromagnetic wave" includes an electron beam, an extreme ultraviolet radiation and the like.

In the present invention, "by irradiation with a particle beam or an electromagnetic wave" means exposing at least one part of the polymer to the particle beam or the electromagnetic wave. Exposing one part of the polymer to the particle beam or the electromagnetic wave excites or ionizes a certain part of the polymer, and an active species is generated. A secondary reaction such as decomposing one part of the unit by the active species, adding the active species to the unit and eliminating a hydrogen atom from the unit by the active species occurs, and generates a radical. Here, "an active species" refers to a radical cation, a radical, an electron and the like.

Hereinafter, the present invention will be described in detail, but the present invention is not limited thereto.

<1> Polymer

A polymer of some embodiments of the present invention comprises: a unit A; and a unit B, wherein the unit A has an onium salt structure and generates a first radical, the unit B has a radical generating structure containing at least one multiple bond selected from the group consisting of: a multiple bond between a carbon atom and a carbon atom; a multiple bond between a carbon atom and a heteroatom.

In the polymer comprising the unit A and the unit B, exposing at least one part of the polymer to the particle beam or the electromagnetic wave generates an anion and the first radical from the unit A by a reduction of the unit A; a radical cation from the unit B, and then a cation and the second radical are generated from the radical cation. The first radical and the second radical form a bond and an intramolecular crosslinking reaction may occur between the units A, between the units B or between the unit A and the unit B.

(Unit A)

The unit A is not limited as long as the unit A has an onium salt structure and is capable of polarity conversion by exposing at least one part of the polymer to the particle beam or the electromagnetic wave, that is, the unit A can generate the anion and the radical by the reduction of the onium salt. Specific examples of the unit A include units represented by the following formula (I).

In the present invention, "polarity conversion" means that a polarity directly or indirectly changes from ionic to nonionic by irradiation with the particle beam or the electromagnetic wave.

[Chem. 1]

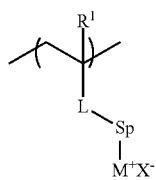

(I)

In the above general formula (I), $M^+$ is a sulfonium ion or an iodonium ion, and $X^-$ is a monovalent anion.

L is not limited as long as L can combine with a main chain constituting the polymer and the onium salt structure, but L is, for example, any one selected from the group consisting of: a carbonyloxy group, a phenylenediyl group, a naphthalenediyl group, a phenylenediyloxy group, a naphthalenediyloxy group, a phenylenediylcarbonyloxy group, a naphthalenediylcarbonyloxy group, a phenylene diyloxycarbonyl group and a naphthalenediyloxycarbonyl group.

L is preferably carbonyloxy group or the like from a viewpoint of an ease of synthesis.

Sp is not limited as long as Sp can be a spacer between L and the onium salt, but Sp is, for example, any one selected from the group consisting of: a direct bond; a linear, branched or cyclic alkylene group which may have a substituent, the alkylene group having 1 to 6 carbon atoms; and a linear, branched or cyclic alkenylene group which may have a substituent, the alkenylene group having 1 to 6 carbon atoms. At least one methylene group in Sp may be substituted with a divalent heteroatom-containing group.

Examples of the linear alkylene group having 1 to 6 carbon atoms as Sp include a methylene group, an ethylene group, a n-propylene group, a n-butylene group, a n-pentylene group and a n-hexylene group.

Examples of the branched alkylene group having 1 to 6 carbon atoms as Sp include an isopropylene group, an isobutylene group, a tert-butylene group, an isopentylene group, a tert-pentylene group and a 2-ethylhexylene group.

Examples of the cyclic alkylene group having 1 to 6 carbon atoms as Sp include a cyclopropylene group, a cyclobutylene group, a cyclopentylene group and a cyclohexylene group.

At least one methylene group in Sp may be substituted with a divalent heteroatom-containing group. Examples of the divalent heteroatom-containing group include —O—, —CO—, —COO—, —OCO—, —O—CO—O—, —NHCO—, —CONH—, —NH—CO—O—, —O—CO—NH—, —NH—, —N($R^{Sp}$)—, —N($Ar^{Sp}$)—, —S—, —SO— and —$SO_2$—. Examples of $R^{Sp}$ include a linear, branched or cyclic alkyl group having 1 to 12 carbon atoms, and examples of $Ar^{Sp}$ include an aryl group having 12 or less carbon atoms such as a phenyl group and a naphthyl group. The number of carbon atoms of the alkylene group of Sp does not include the number of carbon atoms of the substituent that Sp may have.

Examples of the substituent that Sp may have include: a linear or cyclic alkyl group having 1 to 12 carbon atoms; an alkyl group wherein at least one methylene group in the alkyl group is substituted with a heteroatom-containing group selected from the group consisting of: —O—, —CO—, —COO—, —OCO—, —O—CO—O—, —NHCO—, —CONH—, —NH—CO—O—, —O—CO—NH—, —NH—, —N($R^{Sp}$)—, —N($Ar^{Sp}$)—, —S—, —SO— and —$SO_2$—; an aryl group; and a heteroaryl group.

Examples of the alkyl group and the alkyl group having a heteroatom-containing group as the substituent of Sp are the same as the Sp.

Examples of the aryl group as the substituent of Sp are the same as $Ar^{Sp}$. Examples of the heteroaryl group as the substituent of Sp include groups having a skeleton such as furan, thiophene, pyrrole, imidazole, pyran, pyridine, pyrimidine and pyrazine.

Sp may be a direct bond, but from a viewpoint of the crosslinking reaction between the unit A and the unit B, Sp is preferably a spacer structure so that the molecule is easy to move. Preferable examples of Sp include an alkylene group, an alkyleneoxy group and an alkylene carbonyloxy group.

$R^1$ is any one selected from the group consisting of: a hydrogen atom; a linear, branched or cyclic alkyl group having 1 to 6 carbon atoms; a linear, branched or cyclic alkenyl group having 1 to 6 carbon atoms, and at least one hydrogen atom in the alkyl group and the alkenyl group in $R^1$ may be substituted with a fluorine atom.

Examples of the linear alkyl group as $R^1$ having 1 to 6 carbon atoms include a methyl group, an ethyl group, a n-propyl group, a n-butyl group, a n-pentyl group and a n-hexyl group.

Examples of the branched alkyl group as $R^1$ having 1 to 6 carbon atoms include an isopropyl group, an isobutyl group, a tert-butyl group, an isopentyl group, a tert-pentyl group and a 2-ethylhexyl group.

Examples of the cyclic alkyl group as $R^1$ having 1 to 6 carbon atoms include a cyclopropyl group, a cyclobutyl group, a cyclopentyl group and a cyclohexyl group.

Examples of the linear, branched or cyclic alkenyl group as $R^1$ having 1 to 6 carbon atoms include a group wherein at least one carbon-carbon single bond in the liner, branched or cyclic alkyl group described above is substituted with a carbon-carbon double bond.

Moreover, $R^1$ may be a fluorinated alkyl group and a fluorinated alkenyl group wherein at least one hydrogen atom of the alkyl group and the alkenyl group in $R^1$ is substituted with a fluorine atom. All hydrogen atoms of the alkyl group and the alkenyl group in $R^1$ may be substituted with fluorine atoms. As the fluorinated alkyl group, trifluoromethyl group or the like is preferred.

$M^+$ is a sulfonium cation or an iodonium cation having a bond to Sp, specifically, represented by the following general formulas (a1) and (a2).

[Chem. 2]

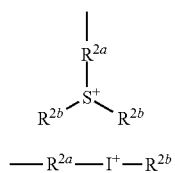

In the above general formulas, $R^{2a}$ is any one selected from the group consisting of: a linear, branched or cyclic alkylene group which may have a substituent, the alkylene group having 1 to 6 carbon atoms; a linear, branched or cyclic alkenylene group which may have a substituent, the alkenylene group having 1 to 6 carbon atoms; an arylene group which may have a substituent, the arylene group having 6 to 14 carbon atoms; a heteroarylene group which may have a substituent, the heteroarylene group having 4 to 12 carbon atoms; and a direct bond.

Examples of the linear, branched or cyclic alkylene group as $R^{2a}$ are the same as that of SP.

Examples of the linear, branched or cyclic alkenylene group as $R^{2a}$ are the same as that of Sp.

Examples of the arylene group as $R^{2a}$ having 6 to 14 carbon atoms include a phenylene group and a naphthylene group.

Examples of the heteroarylene group as $R^{2a}$ having 4 to 12 carbon atoms include groups having a skeleton such as furan, thiophene, pyrrole, imidazole, pyran, pyridine, pyrimidine, pyrazine, indole, purine, quinoline, isoquinoline, chromene, thianthrene, dibenzothiophene, phenothiazine, phenoxazine, xanthene, acridine, phenazine and carbazole.

Examples of the alkyl group, alkenyl group, aryl group and heteroaryl group as $R^{2b}$ include a monovalent group formed from the alkylene group, alkenylene group, arylene group and heteroarylene group as $R^{2a}$.

Examples of the substituents of $R^{2a}$ and $R^{2b}$ include a linear or cyclic alkyl group having 1 to 12 carbon atoms; an alkyl group containing a heteroatom-containing group; an aryl group; and a heteroaryl group. These groups are the same as the substituents which Sp may have.

In the above formula (a1), any two selected from $R^{2a}$ and two of $R^{2b}$ may bond to each other to form a ring structure with a sulfur atom to which they bond.

Examples of the sulfonium cation as $M^+$ include a cation having a structure described below and having a bond to Sp at any position. The compounds described below may have the above mentioned substituent at positions corresponding to $R^{2a}$ and $R^{2b}$.

[Chem. 3]

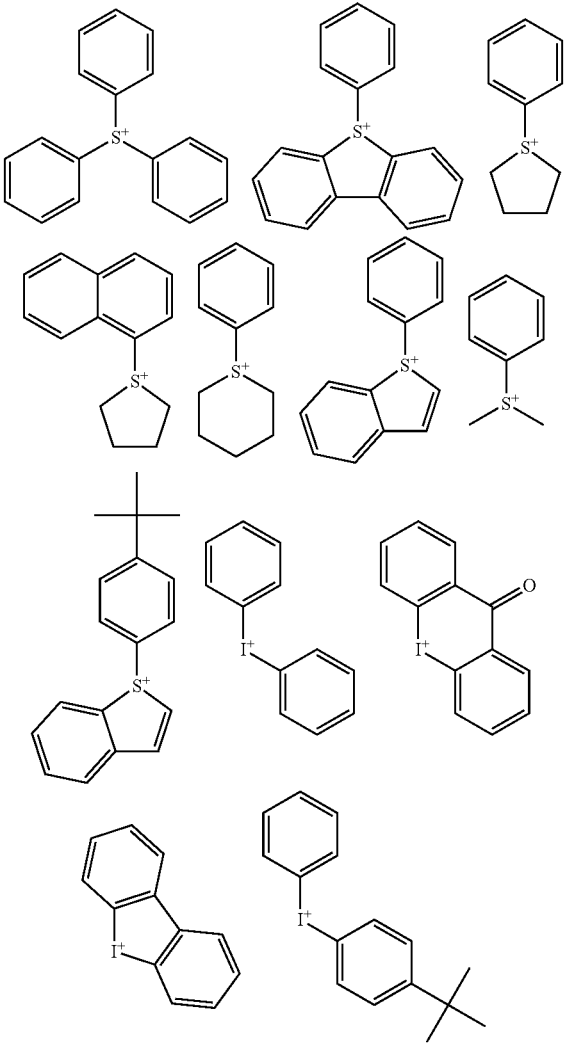

Examples of $X^-$ include any one selected from the group consisting of: an alkylsulfonate anion, an arylsulfonate anion, an alkylcarboxylate anion, an arylcarboxylate anion, a tetrafluoroborate anion, a hexafluorophosphonate anion, a dialkylsulfonylimide anion, a trialkylsulfonate methide anion, a tetrakisphenylborate anion, a hexafluoroantimonate anion, a monovalent metal oxonium anion and a hydrogen acid anion containing the anion. At least one hydrogen atom of the alkyl group and the aryl group in $X^-$ may be substituted with a fluorine atom.

Examples of the metal oxonium anions include $NiO_2$— and $SbO_3$—. In addition, the metal oxonium anion may be a monovalent anion formed from a divalent or trivalent anion such as $VO_4^{3-}$, $SeO_3^{2-}$, $SeO_4^{2-}$, $MoO_4^{2-}$, $SnO_3^{2-}$, $TeO_3^{2-}$, $TeO_4^{2-}$, $TaO_3^{2-}$ and $WO_4^{2-}$ by adding $H^+$, a sulfonium ion, an iodonium ion and a monovalent or divalent metal cation. The monovalent or divalent metal cation may be usual one, for example, $Na^+$, $Sn^{2+}$, $Ni^{2+}$ and the like.

When $X^-$ is the metal oxonium anion, a metal of the metal oxonium anion is preferably at least one selected from the group consisting of: Al, Cr, Mn, Fe, Co, Ni, Cu, Zn, Ga, Ge, Rh, Pd, Ag, Cd, In, Sn, Sb, Te, I, Xe, Hf, Ta, W, Re, Os, Ir, Pt, Au, Hg, Tl, Pb, Bi, Po, At, Rn and Ra. This is because the sensitivity to the particle beam or the electromagnetic wave is improved. Specific examples of the metal oxonium anion preferably include $SbF_6-$, $SbO_3-$, $Sb(OH)_6-$ and $HWO_4-$.

The unit A is preferably represented by a following formula (II).

[Chem. 4]

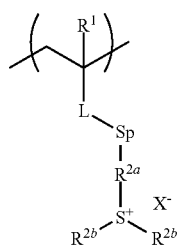

(II)

In the above general formula (II), L, Sp and $X^-$ are the same as those in the general formula (I), and $R^{2a}$ and $R^{2b}$ are the same as those in the general formula (a1).

(Unit B)

The unit B has a radical generating structure containing at least one multiple bond selected from the group consisting of: a multiple bond between a carbon atom and a carbon atom; a multiple bond between a carbon atom and a heteroatom. The unit B is not limited as long as the unit B generates a second radical by exposing at least one part of the polymer to a particle beam or a electromagnetic wave.

The multiple bond in the unit B is not limited as long as the unit B generates a radical cation with the particle beam or the electromagnetic wave and the radical cation decomposes into the second radical and the cation, but the multiple bond is not preferably contained in the benzenoid aromatic and is preferably at least one of the bonds described below. The benzenoid aromatic includes not only a benzene but also aromatics having a benzene skelton such as naphthalene and azulene. "The multiple bond is not contained in the benzenoid aromatic" refer to that the multiple bond is not a bond which the benzenoid aromatic has.

[Chem. 5]

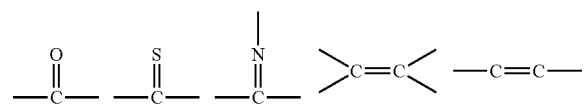

Specific examples of the radical generating structure containing the multiple bond include structure having any one selected from the group consisting of an alkylphenone skeleton, an acyloxime skeleton and a benzil ketal. As long as the structure has these skeletons, the structure may have any substituent. The structure having the alkylphenone skeleton includes an α-aminoacetophenone skeleton and the like. More specifically, examples of the unit B preferably include at least one represented by the following general formulas (III) to (V).

[Chem. 6]

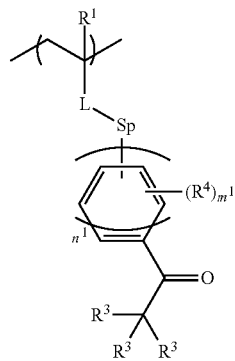

(III)

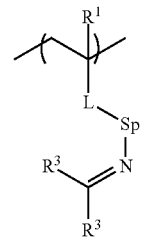

(IV)

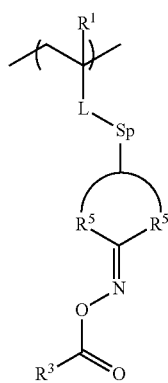

(V)

In the above general formulas (III) to (V), examples of $R^1$, L and Sp are the same as those in the general formula (II).

Each of $R^3$ is independently any one selected from the group consisting of a hydrogen atom; a hydroxy group; —$R^a$ ($R^a$ is a linear, branched or cyclic alkyl group which may have a substituent, the alkyl group having 1 to 12 carbon atoms.); —$OR^a$; a group, wherein at least one carbon-carbon single bond in Re is substituted with a carbon-carbon double bond; and —$R^b$ ($R^b$ is an aryl group which may have a substituent, the aryl group having 6 to 14 carbon atoms.).

Two or more of $R^3$ may form a ring structure with each other through a direct single bond, or any one selected from the group consisting of an oxygen atom, a sulfur atom and a methylene group.

In the formula (III), one of three $R^3$ may be OH.

$R^4$ is any one selected from the group consisting of: —$R^a$; —$R^b$; —$OR^a$; —$SR^a$; —$OR^b$; —$SR^b$; —OC(=O)$R^a$; —OC(=O)$R^b$; —C(=O)O$R^a$; —C(=O)O$R^b$; —OC(=O)O$R^a$; —OC(=O)O$R^b$; —NHC(=O)$R^a$; —$NR^aC$(=O)$R^a$; —NHC(=O)$R^b$; —$NR^b$C(=O)$R^b$; —$NR^a$C(=O)$R^b$; —$NR^b$C(=O)$R^a$; —N($R^a$)$_2$; —N($R^b$)$_2$; —N($R^a$)($R^b$); —$SO_3R^a$; —$SO_3R^b$; —$SO_2R^a$; —$SO_2R^b$; a group wherein at least one carbon-carbon single bond in Re is substituted with a carbon-carbon double bond; and a nitro group.

$n^1$ is an integer of 1 to 3, $m^1$ is an integer of 0 to 4 when $n^1$ is 1, $m^1$ is an integer of 0 to 6 when $n^1$ is 2, and $m^1$ is 0 to 8 when $n^t$ is 3.

$R^5$ is any one selected from the group consisting of a linear, branched or cyclic alkylene group which may have a substituent, the alkylene group having 1 to 12 carbon atoms; a linear, branched or cyclic alkyleneoxy group which may have a substituent, the alkyleneoxy group having 1 to 12 carbon atoms; a linear, branched or cyclic alkenylene group which may have a substituent, the alkenylene group having 1 to 12 carbon atoms; a linear, branched or cyclic alkenyleneoxy group which may have a substituent, the alkenyleneoxy group having 1 to 12 carbon atoms; an arylene group which may have a substituent, the arylene group having 6 to 14 carbon atoms; and a heteroarylene group which may have a substituent, the heteroarylene group having 4 to 12 carbon atoms.

Specific examples of the unit B are represented below.

[Chem. 7]

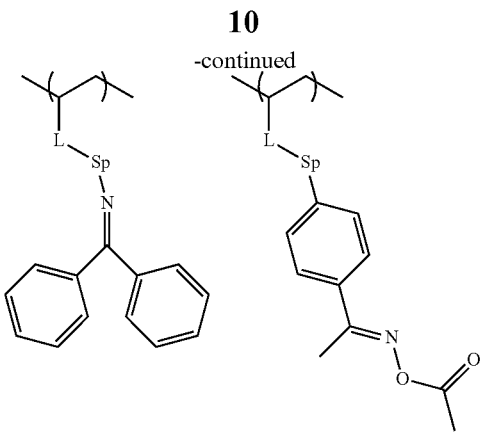

(Unit C)

The polymer may include a unit C wherein at least one compound represented by the general formulas (VI) to (VIII) bonds at any position in the compound to the * portion of the following formula (1). When the polymer contains the unit C the sensitivity to the particle beam or the electromagnetic wave can be improved.

When the polymer contains the structure of the compound represented by the general formula (VIII) as the unit C, $X^-$ of the onium salt which has high acidity such as $BF_2-$, $PF_6-$ or $SbF_6-$ is preferably selected. Thereby, the compound represented by the general formula (VIII) has an especially high sensitizing effect.

[Chem. 8]

(1)

In the formula (1), $R^1$, L and Sp are the same as those in the formula (I). The compounds represented by formulas (VI) to (VIII) will be described later.

(Unit D)

The polymer in an embodiment of the present invention preferably further comprises a radical scavenger unit (hereinafter also referred to as "unit D") in addition to the units A to C. The unit D is preferably a unit wherein a phenol structure or a hindered amine structure bonds at any position of the structure to the * portion of the formula (1).

The unit D is not limited as long as the unit D can stabilize the radical generated by the unit A and the unit B, but specific examples of the unit D is represented below.

[Chem. 9]

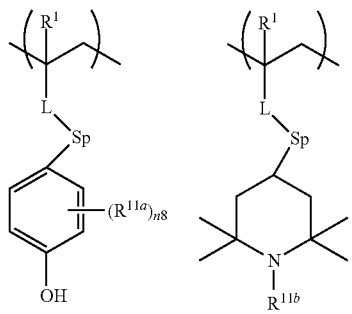

In the above general formula, it is preferred that each of $R^{11a}$ is independently any one selected from the group consisting of a hydrogen atom and an alkyl group. The alkyl group as $R^{11a}$ may have a substituent.

Examples of the alkyl group include a linear or branched alkyl group having 1 to 5 carbon atoms such as a methyl group, an ethyl group, an isopropyl group, a n-isopropyl group, a sec-butyl group, a tert-butyl group and the like.

Examples of the substituent which the alkyl group may have include a hydroxy group, a sulfonyloxy group, an alkylcarbonyloxy group, an alkyloxycarbonyl group, a cyano group, a methoxy group, an ethoxy group.

$n^8$ is 4.

In the above general formula, $R^{11b}$ is preferably any one selected from the group consisting of a hydrogen atom, an oxy group, an alkyl group and an alkoxy group which may have a substituent. When $R^{11b}$ is the oxy group, the unit D has a nitroxide radical, which is stable at steady state.

Examples of the alkyl group as $R^{11b}$ include a linear or branched alkyl group having 1 to 5 carbon atoms such as a methyl group, an ethyl group, an isopropyl group, a n-isopropyl group, a sec-butyl group, a tert-butyl group, a n-butyl group and a pentyl group.

Examples of the alkoxy group as $R^{11b}$ include an alkoxy group having 1 to 15 carbon atoms such as a methoxy group, an ethoxy group and a propoxy group.

Examples of the substituent which $R^{11b}$ may have include a hydroxy group, a sulfonyloxy group, an alkylcarbonyloxy group, a cyano group and an alkoxy group.

In the above formula (III), two or more of $R^4$ may form a ring structure through a direct single bond, or any one selected from the group consisting of an oxygen atom, a sulfur atom and a methylene group.

Specific examples of the unit D include units composed of monomers such as 4-hydroxyphenyl (meth)acrylate and 2,2,6,6-tetramethyl-4-piperidyl (meth)acrylate.

The polymer comprising the unit D can promote the crosslinking stably when the polymer is irradiated with the particle beam or the electromagnetic wave.

(Unit E)

The polymer in an embodiment of the present invention preferably further comprises an organometallic compound-containing unit E contains a metal atom selected from the group consisting of Sn, Sb, Ge, Bi and Te (hereinafter also referred to as "unit E") in addition to the units A to D.

The metal atom contained in the unit E is not limited as long as the metal atom has high absorption to EUV or the electron beam, and may be an atom of Groups 10 to 16 of the periodic table in addition to the above mentioned metal atoms.

The unit E is preferably a unit wherein any one structure selected from the group consisting of: an alkyl and aryltin; an alkyl and arylantimony; an alkyl and arylgermane; and an alkyl and arylbismuthin bonds at any position in the structure to the * portion of the formula (1).

The unit E has high efficiency for a secondary electron generation with EUV irradiation and can improve efficiency for the decomposition of the unit A and the unit B. The unit E is not limited as long as the unit E contains the metal atom having high EUV absorption. Specific examples of the unit E are represented below.

[Chem. 10]

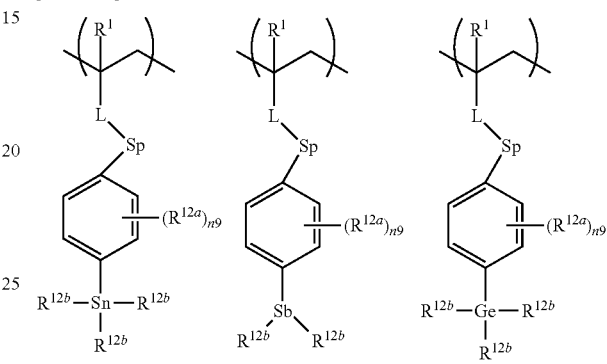

In the above general formula, it is preferred that each of $R^{12a}$ is independently selected from the group consisting of a hydrogen atom and an alkyl group. The alkyl group as $R^{12a}$ may have a substituent.

Example of the alkyl group include a linear or branched alkyl group having 1 to 5 carbon atoms such as a methyl group, an ethyl group, an isopropyl group, a n-isopropyl group, a sec-butyl group, a tert-butyl group, a n-butyl group and a pentyl group.

Examples of the substituent which the alkyl group may have include a hydroxy group, a sulfonyloxy group, an alkylcarbonyloxy group, an alkyloxycarbonyl group, a cyano group, a methoxy group and an ethoxy group.

$n^9$ is 4.

In the above general formula, $R^{12b}$ is any one selected from the group consisting of: a linear, branched or cyclic alkyl group which may have a substituent, the alkyl group having 1 to 6 carbon atoms; a linear, branched or cyclic alkenyl group which may have a substituent, the alkenyl group having 1 to 6 carbon atoms; an aryl group which may have a substituent, the aryl group having 6 to 14 carbon atoms; a heteroaryl group which may have a substituent, the heteroaryl group having 4 to 12 carbon atoms; and a direct bond.

Examples of the linear, branched or cyclic alkyl group as $R^{12b}$ are the same as those in $R^{2b}$.

Examples of the linear, branched or cyclic alkenyl group as $R^{12b}$ are the same as those in $R^{2b}$.

Examples of the aryl group as $R^{12b}$ having 6 to 14 carbon atoms are the same as those in $R^{2b}$. Examples of the heteroaryl group as $R^{12b}$ having 4 to 12 carbon atoms are the same as those in $R^{2b}$.

Two or more of $R^{12a}$ may form a ring structure with each other through a direct single bond, or any one selected from the group consisting of an oxygen atom, a sulfur atom and a methylene group. Moreover, any two of three $R^{12b}$ may bond to each other to form a ring structure with the metal atom to which they bond.

Specific examples of the unit E include units composed of monomers such as 4-vinylphenyl-triphenyltin, 4-vinylphenyl-tributyltin, 4-isopropenylphenyl-triphenyltin, 4-isopropenylphenyl-trimethyltin, trimethyltin acrylate, tributyltin acryrate, triphenyltin acrylate, trimethyltin methacrylate, tributyltin methacrylate, triphenyltin methacrylate, 4-vinylphenyl-diphenylantimony, 4-isopropenylphenyl-diphenylantimony, 4-vinylphenyl-triphenylgermane, 4-vinylphenyl-tributylgermane, 4-isopropenylphenyl-triphenylgermane and 4-isopropenylphenyl-trimethylgermane.

The polymer comprising the unit E can improve an efficiency for the generation of the secondary electron by irradiation with the particle beam or the electromagnetic wave.

(Other Units)

The polymer in an embodiment of the present invention may further comprise a unit commonly used for a resist composition in addition to the units A to E as long as the effect of the present invention is not impaired.

Examples of the units include a unit (hereinafter also referred to as "unit F") having a skeleton containing an ether group, a lactone skeleton, an ester group, a hydroxy group, an epoxy group, a glycidyl group, an oxetanyl group and the like at the * portion of the formula (1).

The unit preferably has a skeleton containing an epoxy group, a glycidyl group, an oxetanyl group or the like, since a cationic polymerization may also occur when the acid generated from the unit A is a strong acid, that is, $X^-$ is $CF_3SO_3—$ or the like.

Moreover, the polymer in an embodiment of the present invention may further comprise a unit composed of styrene, 4-hydroxystyrene, 2-hydroxy-6-vinylnaphthalene, an acrylic acid ester, a methacrylic acid ester and the like, not having the structure of the above formula (1).

A resist composition in an embodiment of the present invention is characterized in that an intramolecular cross-linking reaction occurs by irradiation with the particle beam or the electromagnetic wave. Therefore, a unit having an acid dissociable group whose solubility in a water-soluble developer is enhanced by an acid is preferably not comprised as the unit when a strong acid is used as the acid generated from the unit A, that is, when $X^-$ is $CF_3SO_3—$ or the like.

In the polymer in an embodiment of the present invention, a molar ratio of each unit to the unit A is preferably as follows: the unit B is 0.2 to 4; the unit C is 0 to 1; the unit D is 0 to 0.5; the unit E is 0 to 2; and the unit F is 0 to 4.

The polymer in an embodiment of the present invention can be obtained by using the monomer components constituting each of the above units as a raw material and polymerizing them in the usual method so that the polymer has the molar ratio.

<2> Resist Composition

A resist composition in an embodiment of the present invention is characterized in that the resist composition comprises the polymer. In addition to the polymer, the resist composition may optionally comprise components such as a sensitizer compound, an organometallic compound and an organometallic complex. Each component will be described below.

(Sensitizer Compound)

The resist composition in an embodiment of the present invention may comprise only the polymer, and may further comprise other components such as compounds represented by the following general formulas (VI) to (VIII). The resist composition comprising the compound, which acts as a sensitizer, can improve the sensitivity to the particle beam or the electromagnetic wave.

[Chem. 11]

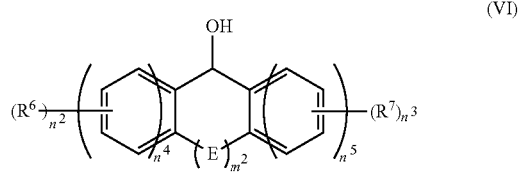

(VI)

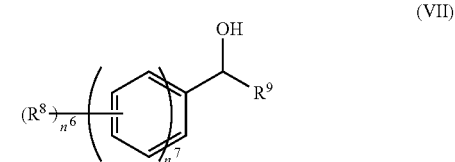

(VII)

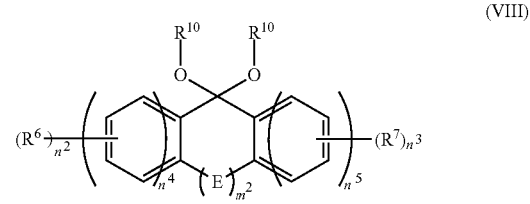

(VIII)

In the general formulas (VI) to (VIII), each of $R^6$, $R^7$ and $R^8$ is independently any one selected from the group consisting of a hydrogen atom, an electron donating group and an electron withdrawing group. At least one of $R^6$ and $R^7$ is preferably the electron donating group.

At least one of $R^8$ is preferably the electron donating group.

Each of $R^9$ and $R^{10}$ is any one selected from the group consisting of a hydrogen atom, an alkyl group and an alkenyl group which may have a substituent, and two of $R^{10}$ may bond each other to form a ring structure with two oxygen atoms to which they bond.

E is preferably any one selected from the group consisting of a direct bond, an oxygen atom, a sulfur atom and a methylene group.

$m^2$ is preferably an integer of 0 or 1. Each of $n^4$ and $n^5$ are preferably an integer of 0 to 2. $n^4+n^5$ is preferably 2.

It is preferred that $n^2$ is an integer of 0 to 4 when $n^4$ is 1, $n^2$ is an integer of 0 to 6 when $n^4$ is 2, $n^3$ is an integer of 0 to 4 when $n^5$ is 1, and $n^3$ is an integer of 0 to 6 when $n^5$ is 2.

$n^6$ is preferably an integer of 0 to 7.

It is preferred that $n^7$ is 1 or 2, $n^6$ is an integer of 0 to 5 when $n^7$ is 1, and $n^6$ is an integer of 0 to 7 when $n^7$ is 2.

Examples of the electron-donating group as $R^6$, $R^7$ and $R^8$ include: an alkyl group ($—R^{13}$); an alkenyl group wherein at least one carbon-carbon single bond in $R^{13}$ is substituted with a carbon-carbon double bond; and an alkoxy group ($—OR^{13}$) and an alkylthio group ($—SR^{13}$) bonding to the aromatic ring at the ortho or para position to the hydroxyl group or the acetal group.

$R^{13}$ is preferably an alkyl group having 1 or more carbon atoms. Specific examples of the alkyl group having 1 or more carbon atoms preferably include: a linear alkyl group such as a methyl group, an ethyl group, a n-propyl group, a n-butyl group, a n-pentyl group, a n-hexyl group, a n-octyl group and a n-decyl group; a branched alkyl group such as an isopropyl group, an isobutyl group, a tert-butyl group, an isopentyl group, a tert-pentyl group and a 2-ethylhexyl group; an alicyclic alkyl group such as a cyclopropyl group, a cyclobutyl group, a cyclopentyl group, a cyclohexyl group, an adamantane-1-yl group, an adamantane-2-yl group, a norbornan-1-yl group and a norbornan-2-yl group; a silyl group-substituted alkyl group wherein one of the hydrogens in the above mentioned groups is substituted with a trialkyl-silyl group such as a trimethylsilyl group, a triethylsilyl group and a dimethylethylsiyl group; and an alkyl group wherein at least one of the hydrogen atoms of the carbon atoms, not directly bonding to the aromatic ring of the compounds (VI) to (VIII), is substituted with a cyano group, a fluoro group or the like.

Examples of the electron withdrawing group as $R^6$, $R^7$ and $R^8$ include: —C(=O)$R^{13a}$ ($R^{13a}$ is a linear, branched or cyclic alkyl group which may have a substituent, the alkyl group having 1 to 12 carbon atoms.); —C(=O)$R^{13b}$ ($R^{13b}$ is an aryl group which may have a substituent, the aryl group having 6 to 14 carbon atoms.); —C(=O)O$R^{13a}$; —SO$_2$$R^{13a}$; —SO$_2$$R^{13b}$; a nitro group; a nitroso group; a trifluoromethyl group; —OR$^a$ bonding at the meta position to a hydroxyl group or an acetal group; —OR$^{12b}$ bonding at the meta position to a hydroxyl group or an acetal group; —SR$^{13a}$ bonding at the meta position to a hydroxyl group or an acetal group; —SR$^{13b}$ bonding at the meta position to a hydroxyl group or an acetal group; a group wherein at least one carbon-carbon single bond in —C(=O)$R^{12a}$, —C(=O)OR$^a$, —SO$_2$$R^{13a}$ or —SR$^{12a}$ is substituted with a carbon-carbon double bond or a carbon-carbon triple bond.

Specific examples of the compounds represented by the above general formulas (VI) to (VIII) (hereinafter also referred to as "a sensitizer compound") are represented below.

[Chem. 12]

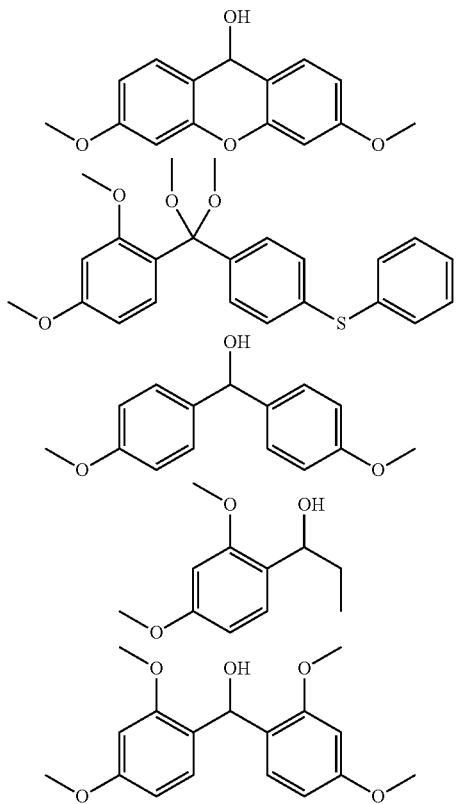

-continued

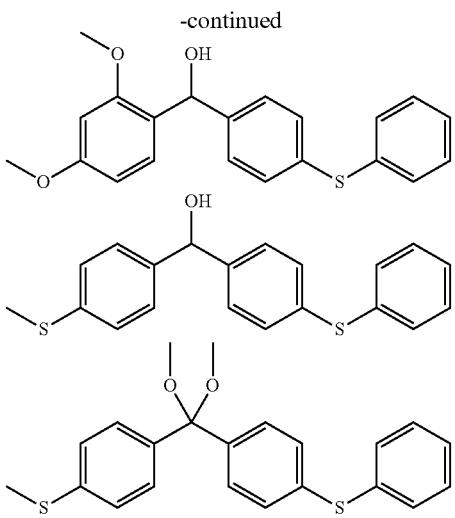

A content of the sensitizer compound in the resist composition is preferably 0 to 1 molar equivalent to the total amount of the unit A and the unit B.

The sensitizer compound may be added to the resist composition as a low molecular weight component, but may be comprised as a unit of the polymer as described above. That is, any of the compounds represented by the general formulas (VI) to (VIII) may be comprised in the polymer as the unit C bonding at any position of the compound to the * portion of the formula (1). In that case, one of $R^6$, $R^7$ and $R^8$ is preferably bonds to the * portion of the formula (1). For example, when the sensitizer compound is the compound represented by the general formula (VI), the sensitizer compound preferably has a bond to the * portion of the formula (1) substituting for one H in $R^6$.

When the compound represented by the general formula (VIII) is used as the sensitizer compound, X$^-$ of the onium salt which has high acidity such as a fluorine-containing alkylsulfonate anion, BF$_4$—, PF$_6$— or SbF$_6$— is preferably selected.

(Organometallic Compound and Organometallic Complex)

The resist composition of an embodiment of the present invention preferably further comprises any of an organometallic compound and an organometallic complex.

Since it is possible to sensitize the unit A and the unit B, a metal of the organometallic compound and the organometallic complex is at least one selected from the group consisting of: Al, Cr, Mn, Fe, Co, Ni, Cu, Zn, Ga, Ge, Rh, Pd, Ag, Cd, In, Sn, Sb, Te, I, Xe, Hf, Ta, W, Re, Os, Ir, Pt, Au, Hg, Tl, Pb, Bi, Po, At, Rn and Ra.

Examples of the organometallic compound include tetraaryltin, tetraalkyltin and bis(alkylphosphine)platinum.

Examples of the organometallic complexe include hafnium(IV) acrylate, zirconium(IV) acrylate, bismuth(III) acrylate, bismuth(III) acetate and tin(II) oxalate.

A content of the organometallic compound and the organometallic complex in the resist composition is preferably 0 to 0.5 molar equivalents to the unit A.

(Other Components)

The resist composition of an embodiment of the present invention may, in any of the embodiments, further comprise other components as long as the effect of the present invention is not impaired. The components may be at least one of known additives including: a fluorine-containing water-repellent polymer, a quencher such as trioctylamine, a surfactant, a filler, a pigment, an antistatic agent, a flame retardant, a light stabilizer, an antioxidant, an ion scavenger and a solvent.

The fluorine-containing water-repellent polymer includes that commonly used in an immersion exposure process. A fluorine atom content of the fluorine-containing water-repellent polymer is preferably higher than that of the above mentioned polymer. Thereby, when a resist film is formed by using the resist composition, the fluorine-containing water-repellent polymer can be localized to a surface of the resist film due to water repellency of the fluorine-containing water-repellent polymer.

<3> Method for Preparing the Resist Composition

A method for preparing the resist composition in an embodiment of the present invention is not limited, and the resist composition may be prepared by a known method such as mixing, dissolving or kneading the polymer and other optional components.

The polymer may be synthesized by proper polymerizing of the monomers constituting the unit A and the unit B, and if necessary, the monomers constituting other units, according to a usual method. However, the method for preparing the polymer of the present invention is not limited thereto.

<4> Method for Manufacturing Device

An embodiment of the present invention is a method for manufacturing a device, comprising: a resist film forming step of forming the resist film on a substrate using the resist composition; a photolithography step of exposing the resist film to the particle beam or the electromagnetic wave; and a pattern forming step of developing an exposed resist film to obtain a photoresist pattern.

Examples of the particle beam or the electromagnetic wave used for exposure in the photolithography step include an electron beam and EUV, respectively.

The exposure dose is, depending on a type and content of each component in the photocurable composition, and the film thickness of the coating film and the like, preferably 1 J/cm$^2$ or less or 1000 μC/cm$^2$ or less.

When the resist composition comprises the sensitizer unit (the unit C) in the polymer or the sensitizer compound, a second exposure to an ultraviolet ray or the like is preferably performed after irradiation with the particle beam or the electromagnetic wave.

EXAMPLES

Hereinafter, some embodiments of the present invention will be described in more detail by examples, but the present invention is not limited by these examples.

<Synthesis of Compound A1 Constituting Unit A>

(Synthesis Example 1) Synthesis of dibenzothiophene-9-oxide

[Chem. 13]

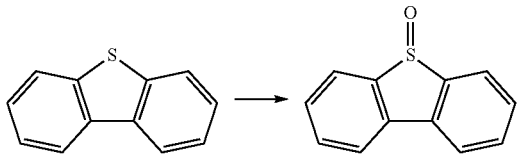

7.0 g of dibenzothiophene is dissolved in 21.0 g of formic acid and set to 35° C. 4.1 g of 35% by mass of aqueous hydrogen peroxide is added dropwise thereto and the mixture is stirred at 25° C. for 5 hours. After cooling, the reaction solution is added dropwise to 50 g of pure water to precipitate. The precipitated solid is filtered, washed twice with 20 g of pure water, and then recrystallized using acetone. After filtration and drying, 7.6 g of dibenzothiophene-9-oxide is obtained.

(Synthesis Example 2) Synthesis of 9-(4-hydroxyphenyl)dibenzothiophenium-trifluoromethanesulfonate

[Chem. 14]

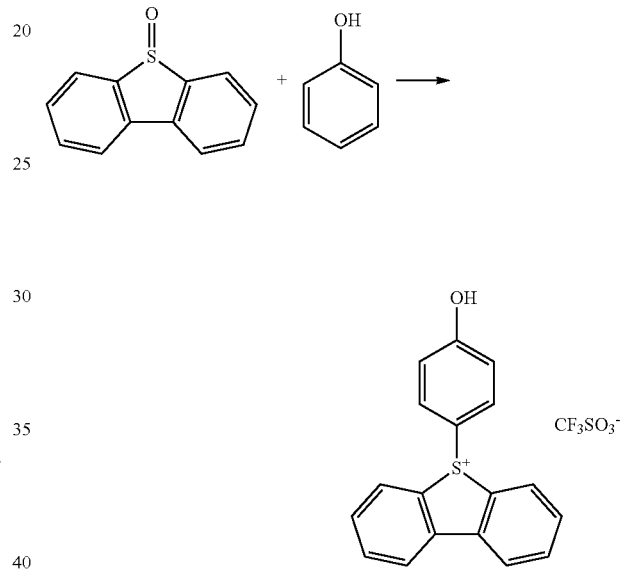

4.0 g of dibenzothiophene-9-oxide obtained in Synthesis Example 1 and 2.8 g of phenol are dissolved in 19 g of methanesulfonic acid and set to 25° C. 1.5 g of diphosphorous pentoxide is added thereto and the mixture is stirred at room temperature for 15 hours. Thereafter, 60 g of pure water is added thereto, the mixture is stirred for further 5 minutes, and then washed twice with 20 g of ethyl acetate. After phase separation, and 3.9 g of potassium trifluoromethanesulfonate and 30 g of methylene chloride are added to the obtained aqueous layer, and the mixture is stirred at room temperature for 2 hours. Thereafter, phase separation is performed, and the obtained organic layer is washed four times with 40 g of pure water. The combined organic layer is concentrated and added dropwise to 100 g of diisopropyl ether to precipitate a solid. The precipitated solid is filtered and dried to obtain 5.6 g of 9-(4-hydroxyphenyl)dibenzothiophenium-trifluoromethanesulfonate.

(Synthesis Example 3) Synthesis of 9-(4-methacryloxyphenyl)dibenzothiophenium-trifluoromethanesulfonate (Compound A1)

[Chem. 15]

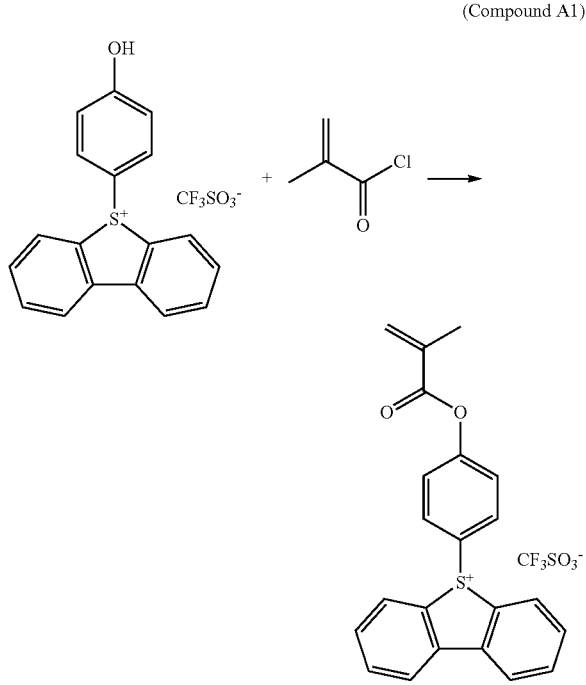

(Compound A1)

5.0 g of 9-(4-hydroxyphenyl)dibenzothiophenium-trifluoromethanesulfonate obtained in Synthesis Example 2 and 1.6 g of methacryloyl chloride are dissolved in 40 g of methylene chloride and set to 25° C. A solution of 1.6 g of triethylamine in 7 g of methylene chloride is added dropwise thereto and the mixture is stirred at 25° C. for 2 hours. After stirring, 20 g of pure water is added, the mixture is stirred for further 10 minutes. After phase separation, the organic layer is washed twice with 20 g of pure water, the combined organic layer is concentrated and added dropwise to 100 g of diisopropyl ether to precipitate. The precipitated solid is filtered and dried to obtain 5.8 g of 9-(4-methacryloxyphenyl)dibenzothiophenium-trifluoromethanesulfonate (Compound A1).

<Synthesis of Compound A2 constituting Unit A>

(Synthesis Example 4) Synthesis of 9-(4-acryloxyphenyl)dibenzothiophenium-trifluoromethanesulfonate (Compound A2)

[Chem. 16]

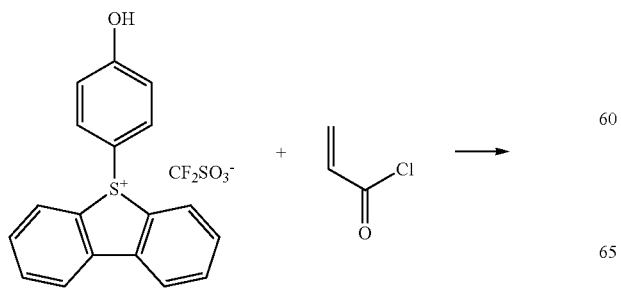

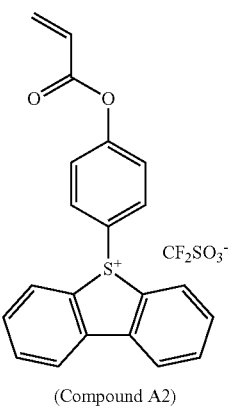

(Compound A2)

4.4 g of 9-(4-acryloxyphenyl)dibenzothiophenium-trifluoromethanesulfonate (Compound A2) is obtained in the same procedure as Synthesis Example 3 except that acryloyl chloride is used instead of methacryloyl chloride.

<Synthesis of Compound A3 Constituting Unit A>

(Synthesis Example 5) Synthesis of 9-(4-hydroxyphenyl)dibenzothiophenium-benzoate

[Chem. 17]

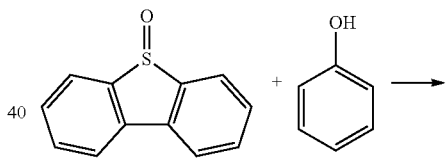

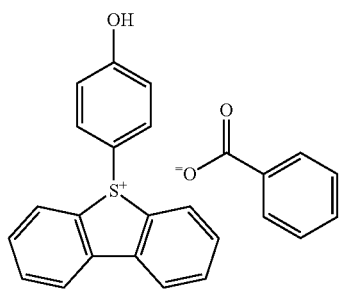

3.2 g of 9-(4-hydroxyphenyl)dibenzothiophenium-benzoate is obtained in the same procedure as Synthesis Example 2 except that benzoic acid is used instead of potassium trifluoromethanesulfonate and the concentrated organic layer is purified by column chromatography (methylene chloride/methanol=70/30 (volume ratio)).

(Synthesis Example 6) Synthesis of 9-(4-methacryloxyphenyl)dibenzothiophenium-benzoate (Compound A3)

[Chem. 18]

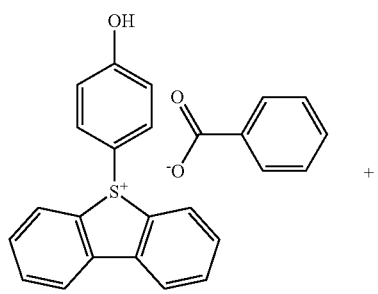

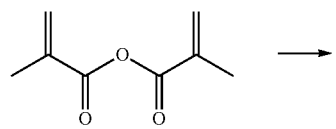

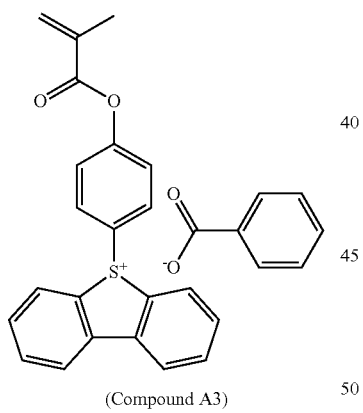

(Compound A3)

5.9 g of 9-(4-methacryloxyphenyl)dibenzothiophenium-benzoate (Compound A3) is obtained in the same procedure as Synthesis Example 3 except that 9-(4-hydroxyphenyl)dibenzothiophenium-benzoate is used instead of 9-(4-hydroxyphenyl)dibenzothiophenium-trifluoromethanesulfonate, methacrylic anhydride is used instead of methacryloyl chloride, and the concentrated organic layer is purified by column chromatography (methylene chloride/methanol=70/30 (volume ratio)).

<Synthesis of Compound A4 constituting Unit A>

(Synthesis Example 7) Synthesis of 9-(4-methacryloxyphenyl)dibenzothiophenium-hexafluoroantimonate (Compound A4)

[Chem. 19]

(Compound A4)

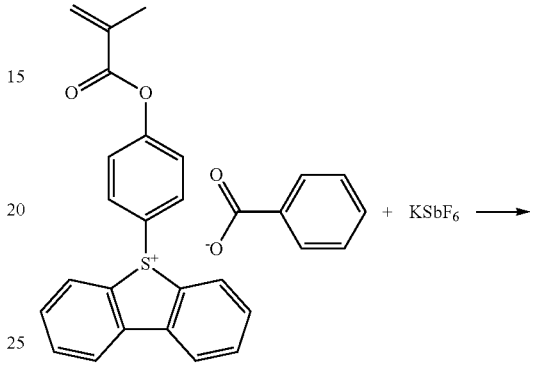

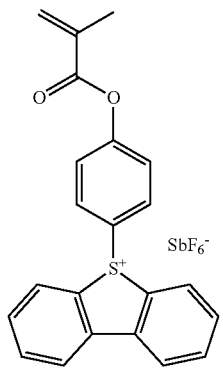

3.0 g of 9-(4-methacryloxyphenyl)dibenzothiophenium-benzoate obtained in Synthesis Example 6 is dissolved in 24 g of methylene chloride, 1.5 g of potassium hexafluoroantimonate and 24 g of pure water are added thereto, and the mixture is stirred at room temperature for 15 hours. Thereafter, phase separation is performed and the combined organic layer is washed with 24 g of pure water. The combined organic layer is concentrated and purified by column chromatography (methylene chloride/methanol=80/20 (volume ratio)) to obtain 2.1 g of 9-(4-methacryloxyphenyl)dibenzothiophenium-hexafluoroantimonate (Compound A4).

<Synthesis of Compound A5 Constituting Unit A>

(Synthesis Example 8) Synthesis of 9-(4-methacryloxyphenyl)dibenzothiophenium-antimonate (Compound A5)

[Chem. 20]

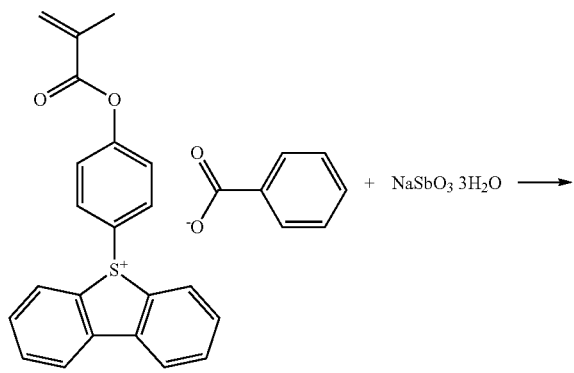

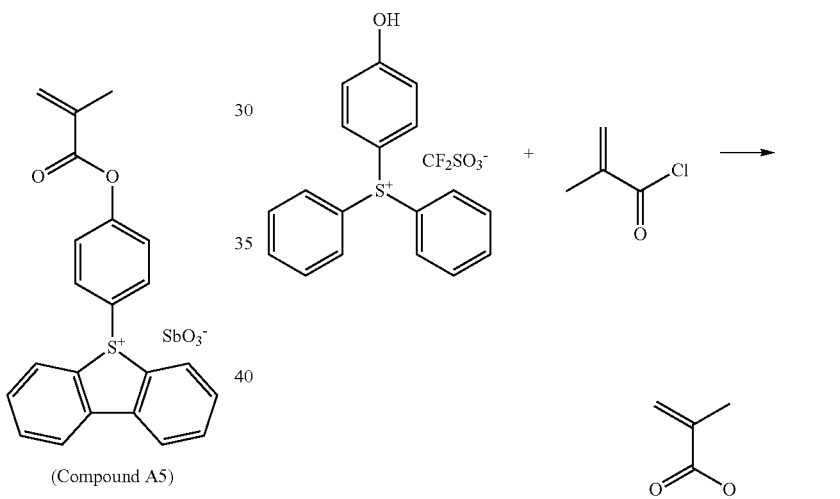

(Compound A5)

2.4 g of 9-(4-methacryloxyphenyl)dibenzothiophenium-antimonate (Compound A5) is obtained in the same procedure as Synthesis Example 7 except that sodium antimonate trihydrate is used instead of potassium hexafluoroantimonate and acetic acid is not added.

<Synthesis of Compound A6 Constituting Unit A>

(Synthesis Example 9) Synthesis of (4-hydroxy)phenyldiphenylsulfonium-trifluoromethanesulfonate

[Chem. 21]

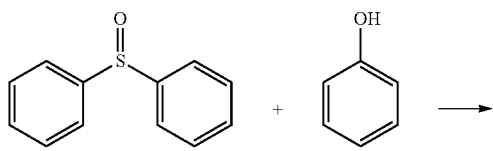

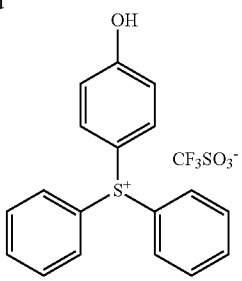

5.2 g of (4-hydroxy)phenyldiphenylsulfonium-trifluoromethanesulfonate is obtained in the same procedure as Synthesis Example 2 except that diphenylsulfoxide is used instead of dibenzothiophene-9-oxide.

(Synthesis Example 10) Synthesis of (4-methacryloxy)phenyldiphenylsulfonium-trifluoromethanesulfonate (Compound A6)

[Chem. 22]

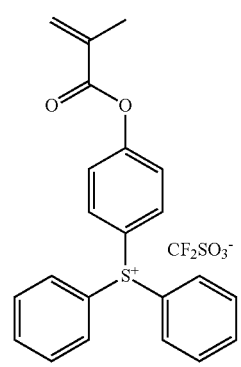

(Compound A6)

5.9 g of 9-(4-methacryloxyphenyl)dibenzothiophenium-benzoate (Compound A6) is obtained in the same procedure as Synthesis Example 3 except that (4-hydroxy)phenyldiphenylsulfonium-trifluoromethanesulfonate is used instead of 9-(4-hydroxyphenyl)dibenzothiophenium-trifluoromethanesulfonate.

<Synthesis of Compound A7 Constituting Unit A>

(Synthesis Example 11) Synthesis of 5-(4-hydroxynaphthyl)tetramethylenesulfonium-trifluoromethanesulfonate

[Chem. 23]

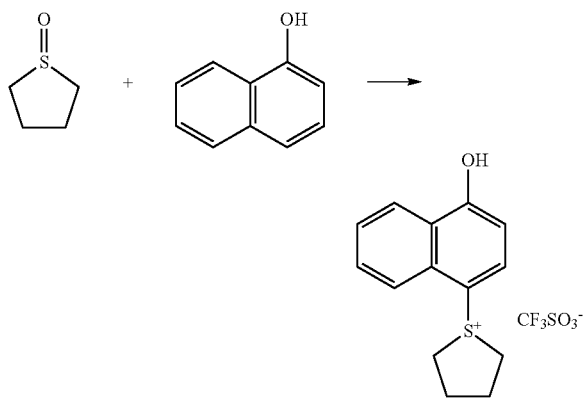

4.7 g of 5-(4-hydroxynaphthyl)tetramethylenesulfonium-trifluoromethanesulfonate is obtained in the same procedure as Synthesis Example 2 except that tetramethylene sulfoxide is used instead of dibenzothiophene-9-oxide and 1-naphthol is used instead of phenol.

(Synthesis Example 12) Synthesis of 5-(4-methacryloxynaphthyl)tetramethylenesulfonium-trifluoromethanesulfonate (Compound A7)

[Chem. 24]

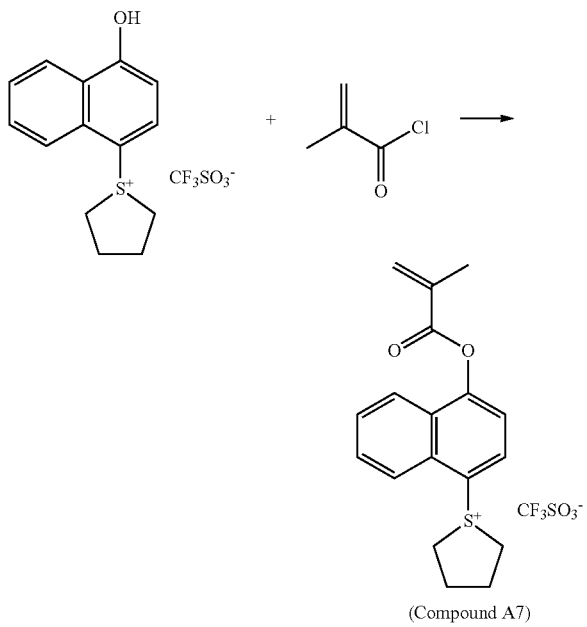

(Compound A7)

5.1 g of 5-(4-methacryloxynaphthyl)tetramethylenesulfonium-trifluoromethanesulfonate (compound A7) is obtained in the same procedure as Synthesis Example 3 except that 5-(4-hydroxynaphthyl)tetramethylenesulfonium-trifluoromethanesulfonate is used instead of 9-(4-hydroxyphenyl)dibenzothiophenium-trifluoromethanesulfonate.

<Synthesis of Compound B1 Constituting Unit B>

(Synthesis Example 13) Synthesis of 1-(4-hydroxyphenyl)-2,2-dimethyl-1-propanone

[Chem. 25]

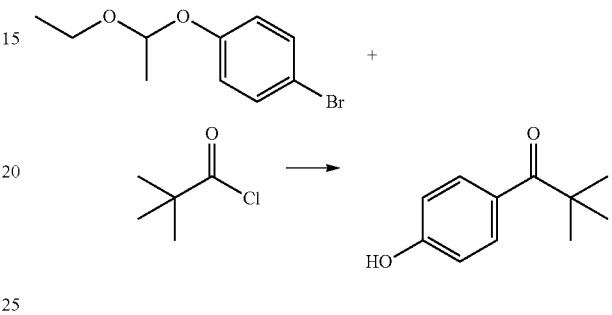

2.0 g of magnesium and 10 g of THF are added to a flask from which moisture has been removed in advance. A solution of 10.0 g of 4-(2-ethoxy)ethoxyphenyl bromide in 50.0 g of THF is added dropwise thereto at room temperature over 1 hour. After the dropwise addition, the mixture is stirred at room temperature for 1 hour, and then the obtained 4-(2-ethoxy)ethoxyphenylmagnesium bromide solution is added dropwise to another flask containing 9.8 g of pivaloyl chloride and 40 g of THF at 5° C. over 30 minutes. After the dropwise addition, the mixture is stirred for 30 minutes, and then 150 g of 3% hydrochloric acid is added and the mixture is further stirred for 10 minutes. Thereafter, THF is evaporated and the mixture is extracted with 150 g of ethyl acetate. Phase separation is performed, and the obtained organic layer is washed three times with 60 g of pure water. Thereafter, the organic layer obtained by the phase separation is concentrated and purified by column chromatography (ethyl acetate/hexane=20/80 (volume ratio)) to obtain 5.8 g of 1-(4-hydroxyphenyl)-2,2-dimethyl-1-propanone.

(Synthesis Example 14) Synthesis of 1-(4-methacryloxyphenyl)-2,2-dimethyl-1-propanone (Compound B1)

[Chem. 26]

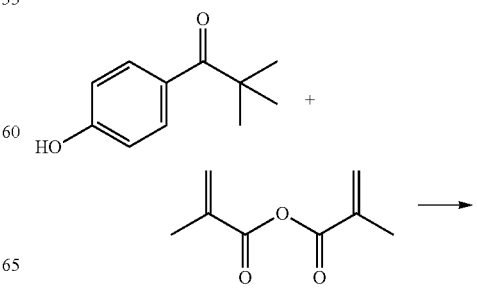

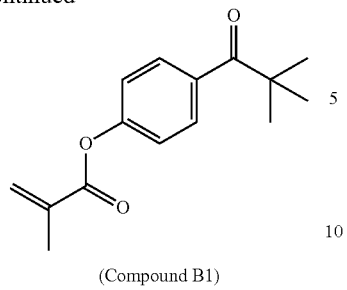

(Compound B1)

4.0 g of 1-(4-hydroxyphenyl)-2,2-dimethyl-1-propanone obtained in Synthesis Example 13 and 4.1 g of methacrylic anhydride are dissolved in 32 g of methylene chloride and set to 25° C. A solution of 2.7 g of triethylamine in 7 g of methylene chloride is added dropwise thereto and the mixture is stirred at 25° C. for 2 hours. After stirring, 20 g of pure water is added, stirred for further 10 minutes, and phase separation is performed. After washing the organic layer twice with 20 g of pure water, the combined organic layer is concentrated and purified by column chromatography (ethyl acetate/hexane=10/90 (volume ratio)) to obtain 4.6 g of 1-(4-methacryloxyphenyl)-2,2-dimethyl-1-propanone (compound B1).

<Synthesis of Compound B2 Constituting Unit B>

(Synthesis Example 15) Synthesis 1-(4-acryloxyphenyl)-2,2-dimethyl-1-propanone (Compound B2)

[Chem. 27]

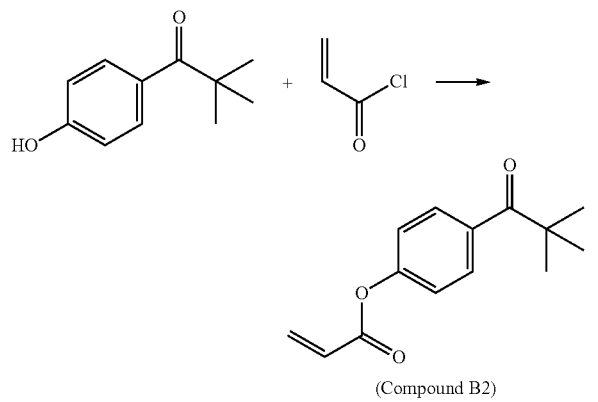

(Compound B2)

5.3 g of 1-(4-acryloxyphenyl)-2,2-dimethyl-1-propanone (Compound B2) is obtained in the same procedure as Synthesis Example 10 except that acryloyl chloride is used instead of methacrylic anhydride.

<Synthesis of Compound B3 Constituting Unit B>

(Synthesis Example 16) Synthesis of 1-(6-hydroxynaphthalen-2-yl)-2,2-dimethyl-1-propanone

[Chem. 28]

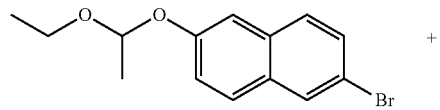

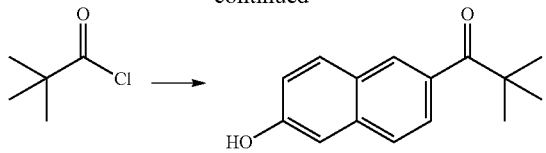

6.9 g of 1-(6-hydroxynaphthalen-2-yl)-2,2-dimethyl-1-propanone is obtained in the same procedure as Synthesis Example 13 except that 2-bromo-6-(2-ethoxy)ethoxynaphthalene is used instead of 4-(2-ethoxy)ethoxyphenyl bromide.

(Synthesis Example 17) Synthesis of 1-(6-methacryloxynaphthalen-2-yl)-2,2-dimethyl-1-propanone (Compound B3)

[Chem. 29]

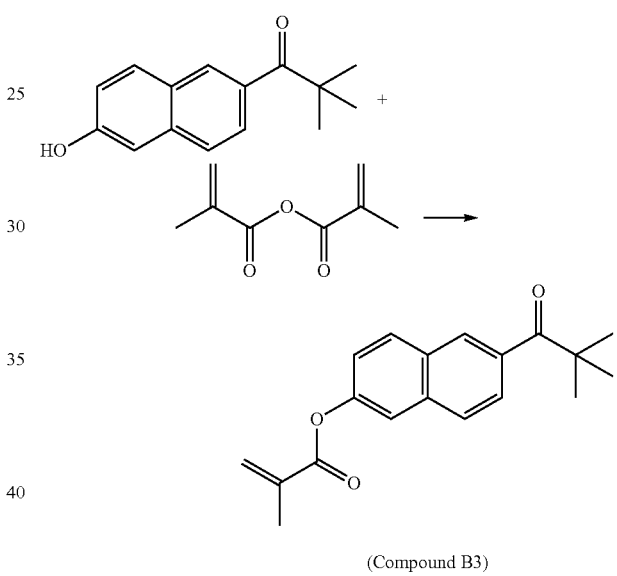

(Compound B3)

5.3 g of 1-(6-methacryloxynaphthalene-2-yl)-2,2-dimethyl-1-propanone (compound B3) is obtained in the same procedure as Synthesis Example 14 except that 1-(6-hydroxynaphthalen-2-yl)-2,2-dimethyl-1-propanone is used instead of 1-(4-hydroxyphenyl)-2,2-dimethyl-1-propanone.

<Synthesis of Compound B4 Constituting Unit B>

(Synthesis Example 18) Synthesis of 1-[4-(2-hydroxyethoxy)phenyl]-2,2-dimethyl-1-propanone

[Chem. 30]

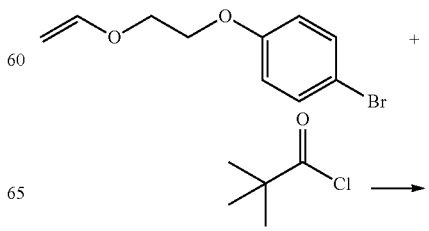

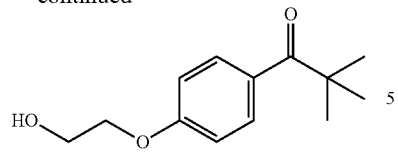

6.3 g of 1-[4-(2-hydroxyethoxy)phenyl]-2,2-dimethyl-1-propanone is obtained in the same procedure as Synthesis Example 13 except that 4-(2-vinyloxy)ethoxyphenyl bromide is used instead of 4-(2-ethoxy)ethoxyphenyl bromide.

(Synthesis Example 19) Synthesis of 1-[4-(2-methacryloxy)ethoxyphenyl]-2,2-dimethyl-1-propanone (Compound B4)

[Chem. 31]

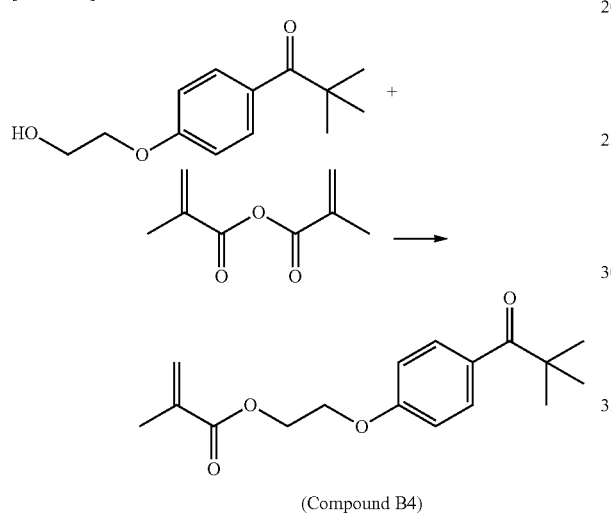

(Compound B4)

5.6 g of 1-[4-(2-methacryloxy)ethoxyphenyl]-2,2-dimethyl-1-propanone (Compound B4) is obtained in the same procedure as Synthesis Example 14 except that 1-(2-hydroxyethoxyphenyl)-2,2-dimethyl-1-propanone is used instead of 1-(4-hydroxyphenyl)-2,2-dimethyl-1-propanone.
<Synthesis of Compound B5 Constituting Unit B>

(Synthesis Example 20) Synthesis of 1-[4-(2-methacryloxy)ethoxyphenyl]-2-hydroxy-2-methyl-1-propanone (Compound B5)

[Chem. 32]

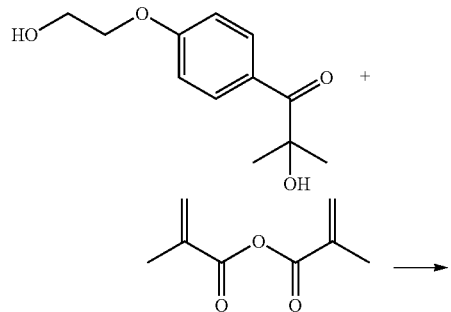

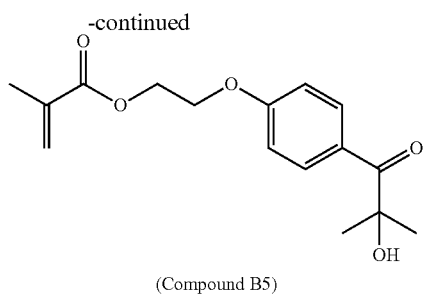

(Compound B5)

6.5 g of 1-[4-(2-methacryloxy)ethoxyphenyl]-2-hydroxy-2-methyl-1-propanone (Compound B5) is obtained in the same procedure as in Synthesis Example 14 except that 1-[4-(2-hydroxyethoxy)-phenyl]-2-hydroxy-2-methyl-1-propan-1-one (IRGACURE 2959) is used instead of 1-(4-hydroxyphenyl)-2,2-dimethyl-1-propanone.
<Synthesis of Compound B6 Constituting Unit B>

(Synthesis Example 21) Synthesis of Phenylglyoxyloyl Chloride

[Chem. 33]

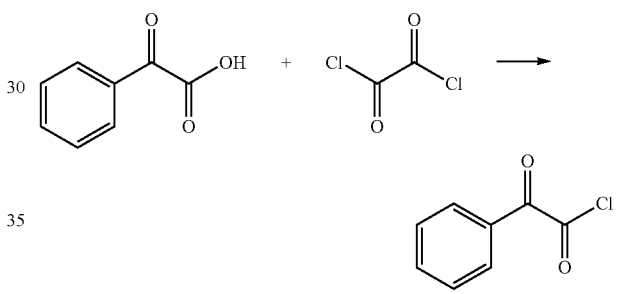

5.0 g of phenylglyoxylic acid is dissolved in 35 g of anisole and set to 50° C. 5.1 g of oxalyl chloride is added dropwise thereto over 10 minutes and the mixture is stirred at 50° C. for 2 hours. The excess oxalyl chloride is evaporated at 70° C., and then anisole is evaporated under reduced pressure and concentrated to obtain 26.3 g of anisole solution of phenylglyoxyloyl chloride.

(Synthesis Example 22) Synthesis of 1-(4-methoxyphenyl)-2-phenylethanedione

[Chem. 34]

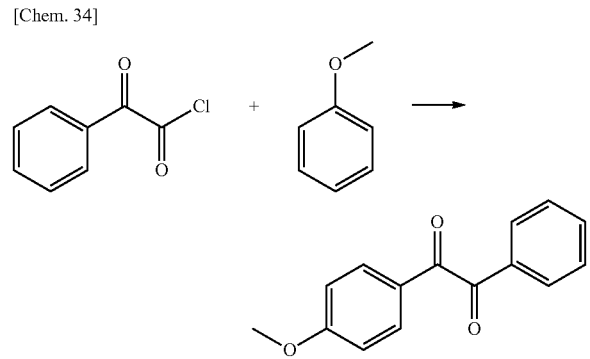

25.0 g of the anisole solution of the pheylglyoxyloyl chloride obtained in Synthesis Example 21 is dissolved in 35 g of methylene chloride and set to 0° C. 4.3 g of aluminum chloride is added thereto and the mixture is stirred at 0° C. for 2 hours. 35 g of pure water is added thereto, and the mixture is stirred for 10 minutes and then phase separation is performed. The obtained organic layer is washed twice with 30 g of pure water, and the combined organic layer is concentrated and purified by column chromatography (ethyl acetate/hexane=10/90 (volume ratio)) to obtain 5.6 g of 1-(4-methoxyphenyl)-2-phenylethanedione.

(Synthesis Example 23) Synthesis of 1-(4-hydroxyphenyl)-2-phenylethanedione

[Chem. 35]

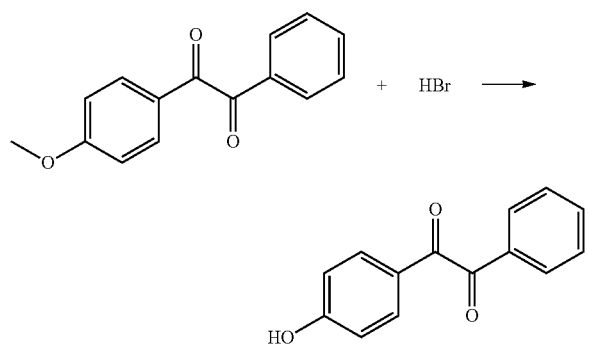

5.0 g of 4-methoxybenzil is dissolved in 95 ml of acetic acid. 33.2 g of 48% by mass of aqueous HBr solution is added dropwise thereto at 70° C. over 10 minutes. After the dropwise addition, the mixture is stirred at 110° C. for 70 hours. Thereafter, 150 g of water is added to crystallize. This is filtered, the crystal is washed with 250 g of water and then dried to obtain 4.1 g of 1-(4-hydroxyphenyl)-2-phenylethanedione.

(Synthesis Example 24) Synthesis of 2,2-dimethoxy-1-(4-methacryloxyphenyl)ethan-1-one (Compound B6)

[Chem. 36]

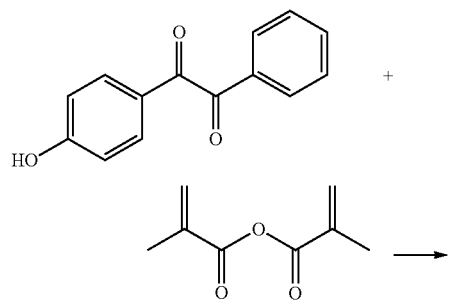

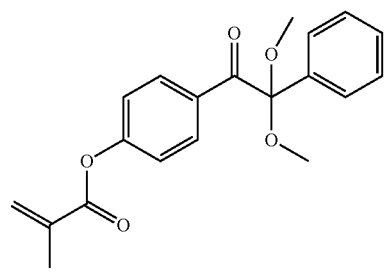

(Compound B6)

4.0 g of 1-(4-hydroxyphenyl)-2-phenylethanedione and 0.10 g of sulfuric acid are dissolved in 12 g of methanol and set to 25° C. 2.2 g of trimethyl orthoformate is added dropwise thereto and the mixture is stirred for 3 hours. After adding 0.6 g of triethylamine at 30° C. and stirring for 5 minutes, the solvent is evaporated. 25 g of acetonitrile, 4.5 g of triethylamine and 0.11 g of dimethylaminopyridine are added to the obtained residue, and 6.8 g of methacrylic anhydride diluted with 5.0 g of acetonitrile is added dropwise at room temperature. After the dropwise addition, the mixture is stirred at 25° C. for 2 hours, then 64 g of 3% by mass of aqueous NaHCO₃ solution is added and stirred for 5 minutes. Thereafter, the mixture is extracted with 32 g of ethyl acetate. After washing three times with 10 g of water, the combined organic layer is concentrated and purified by column chromatography (ethyl acetate/hexane=10/90 (volume ratio)) to obtain 4.3 g of 2,2-dimethoxy-1-(4-methacryloxyphenyl)ethan-1-one (compound B6).

<Synthesis of Compound B7 Constituting Unit B>

(Synthesis Example 25) Synthesis of 9-fluorenone O-methacryloxime (Compound B7)

[Chem. 37]

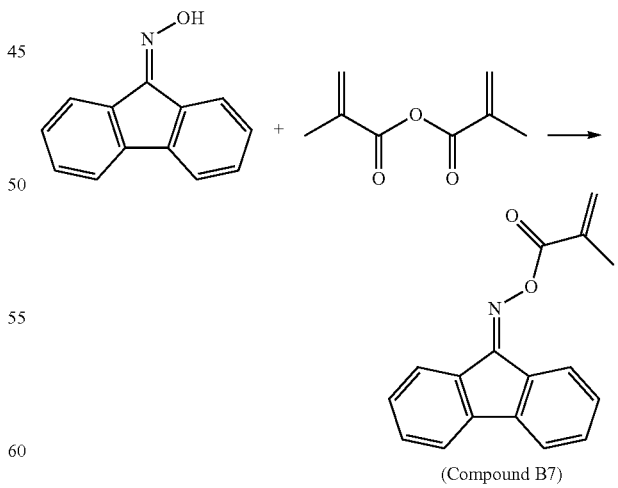

(Compound B7)

4.5 g of 9-fluorenone O-methacryloxime (compound B7) is obtained in the same procedure as in Synthesis Example 14 except that 9-fluorenone oxime is used instead of 1-(4-hydroxyphenyl)-2,2-dimethyl-1-propanone.

<Synthesis of Compound 1 as Sensitizer Compound>

(Synthesis Example 26) Synthesis of 2,2',4,4'-tetramethoxybenzophenone

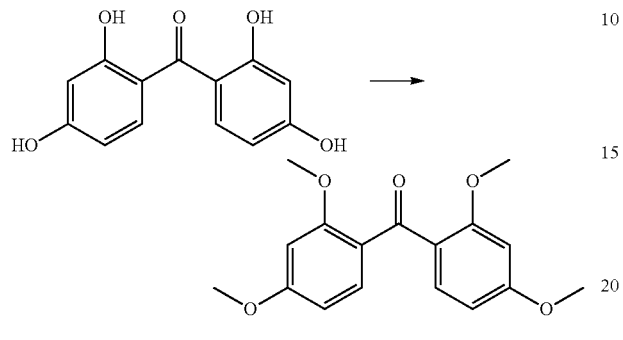

6.0 g of 2,2',4,4'-tetrahydroxybenzophenone, 11.7 g of dimethyl sulfate and 12 g of potassium carbonate are dissolved in 36 g of acetone. The mixture is stirred at reflux temperature for 8 hours. The mixture is cooled to 25° C., 90 g of pure water is added, the mixture is stirred for further 10 minutes, and the precipitate is filtered. The obtained precipitate is dissolved in 60 g of ethyl acetate, the solution is washed three times with 10 g of water, and the combined organic layer is concentrated and recrystallized using 48 g of ethanol to obtain 6.5 g of 2,2',4,4'-tetramethoxybenzophenone.

(Synthesis Example 27) Synthesis of 2,2',4,4'-tetramethoxybenzhydrol (compound 1)

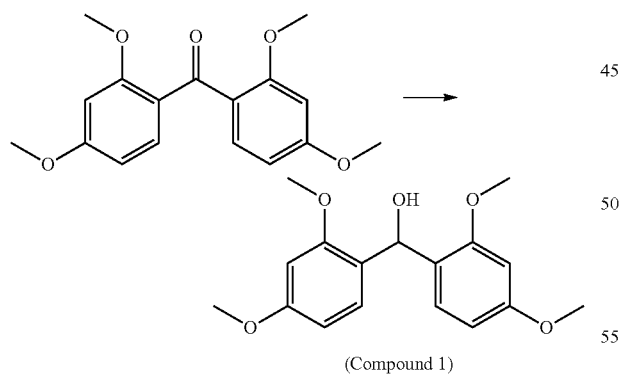

(Compound 1)

4.0 g of 2,2',4,4'-tetramethoxybenzophenone is dissolved in 32 g of ethanol, 1.5 g of sodium borohydride is added thereto, and the mixture is stirred at room temperature for 3 hours. Thereafter, 120 g of pure water is added, and after stirring for further 10 minutes, the precipitate is filtered. The obtained precipitate is dissolved in 80 g of ethyl acetate, the solution is washed three times with 10 g of water, and the combined organic layer is concentrated to obtain 3.5 g of 2,2',4,4'-tetramethoxybenzhydrol.

<Synthesis of Compound C1 constituting Sensitizer Unit C>

(Synthesis Example 28) Synthesis of 2,4-dimethoxy-4'-(2-vinyloxy)ethoxybenzophenone

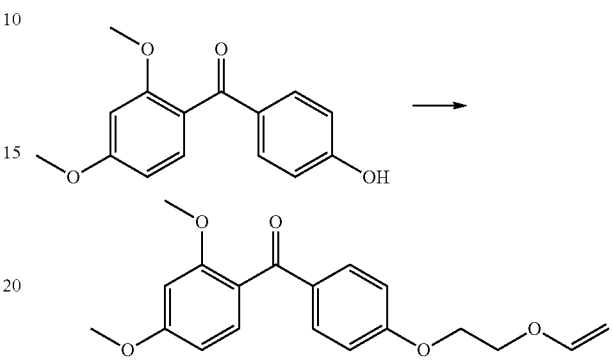

4.0 g of 2,4-dimethoxy-4'-hydroxy-benzophenone, 4.8 g of 2-chloroethyl vinyl ether and 6.4 g of potassium carbonate are dissolved in 24 g of dimethylformamide. The mixture is stirred at 110° C. for 15 hours. Then, the mixture is cooled to 25° C. After addition of 60 g of water, the mixture is further stirred and then extracted with 24 g of toluene. After washing three times with 10 g of water, the combined organic layer is concentrated and purified by column chromatography (ethyl acetate/hexane=10/90 (volume ratio)) to obtain 5.4 g of 2,4-dimethoxy-4'-(2-vinyloxy)ethoxybenzophenone.

(Synthesis Example 29) Synthesis of 2,4-dimethoxy-4'-(2-hydroxy)ethoxybenzophenone

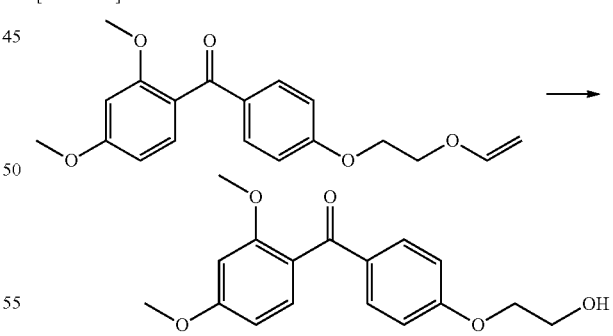

5.4 g of 2,4-dimethoxy-4'-(2-vinyloxy)ethoxybenzophenone, 0.42 g of pyridinium-p-toluenesulfonate and 4.2 g of pure water are dissolved in 36 g of acetone. The mixture is stirred at 35° C. for 12 hours. Then, after addition of 3% by mass of aqueous sodium carbonate solution, the mixture is further stirred and extracted with 42 g of ethyl acetate. After washing three times with 10 g of water, the combined organic layer is concentrated to obtain 2,4-dimethoxy-4'-(2-hydroxy)ethoxybenzophenone.

(Synthesis Example 30) Synthesis of 2,4-dimethoxy-4'-(2-methacryloxy)ethoxybenzophenone

[Chem. 42]

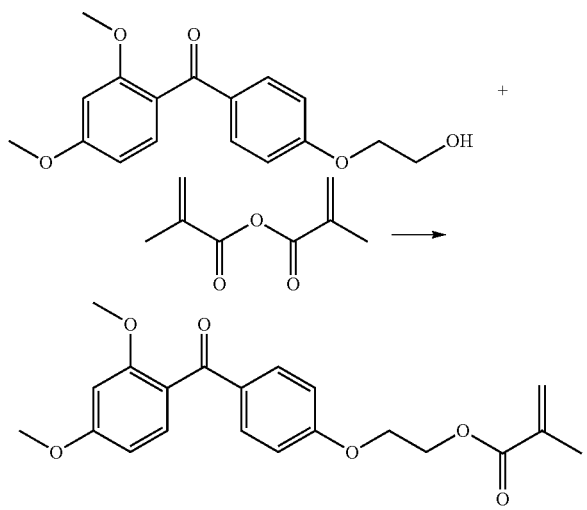

5.4 g of 2,4-dimethoxy-4'-(2-methacryloxy)ethoxybenzophenone is obtained in the same procedure as Synthesis Example 14 except that 2,4-dimethoxy-4'-(2-hydroxy) ethoxybenzophenone is used instead of 1-(4-hydroxyphenyl)-2,2-dimethyl-1-propanone.

(Synthesis Example 31) Synthesis of 2,4-dimethoxy-4'-(2-methacryloxy)ethoxybenzhydrol (Compound C1)

[Chem. 43]

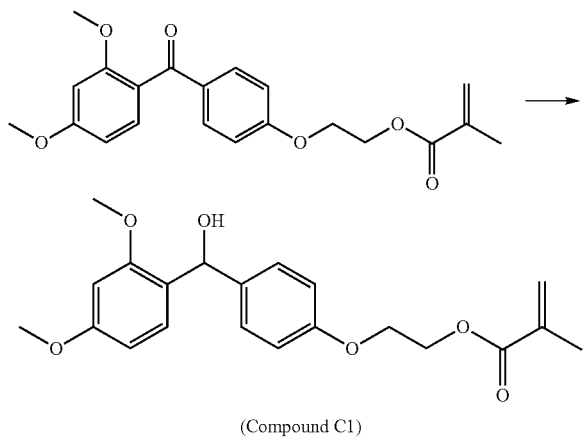

(Compound C1)

3.7 g of 2,4-dimethoxy-4'-(2-methacryloxy)ethoxybenzhydrol (compound C1) is obtained in the same procedure as Synthesis Example 27 except that 2,4-dimethoxy-4'-(2-methacryloxy)ethoxybenzophenone is used instead of 2,2',4,4'-tetramethoxybenzophenone and the residue obtained by concentration is purified by column chromatography (ethyl acetate/hexane=20/80 (volume ratio)).

<Synthesis of Compound C2 Constituting Sensitizer Unit C>

(Synthesis Example 32) Synthesis of 1-(2,4-dimethoxy)phenyl-1-[4'-(2-hydroxy)ethoxyphenyl]-1,1-dimethoxymethane

[Chem. 44]

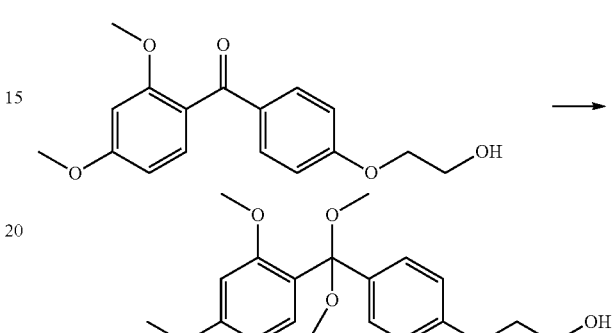

3.3 g of 1-(2,4-dimethoxy)phenyl-1-[4'-(2-hydroxy)ethoxyphenyl]-1,1-dimethoxymethane is obtained in the same procedure as Synthesis Example 24 except that 2,4-dimethoxy-4'-(2-hydroxy)ethoxybenzophenone is used instead of 1-(4-hydroxyphenyl)-2-phenylethanedione.

(Synthesis Example 33) Synthesis of 1-(2,4-dimethoxy)phenyl-1-[4'-(2-methacryloxy)ethoxyphenyl]-1,1-dimethoxymethane (Compound C2)

[Chem. 45]

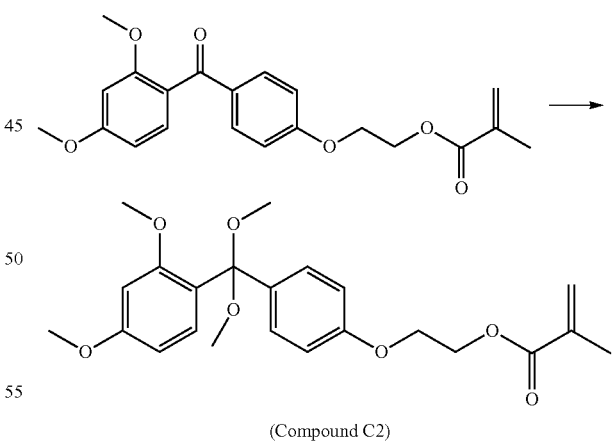

(Compound C2)

3.7 g of 1-(2,4-dimethoxy)phenyl-1-[4'-(2-methacryloxy)ethoxyphenyl]-1,1-dimethoxymethane (Compound C2) is obtained in the same procedure as Synthesis Example 14 except that 2,4-dimethoxy-4'-(2-hydroxy)ethoxybenzophenone is used instead of 1-(4-hydroxyphenyl)-2,2-dimethyl-1-propanone.

<Synthesis of Compound E1 Constituting Unit E>

(Synthesis Example 34) Synthesis of
4-vinylphenyl-triphenyltin (Compound E1)

[Chem. 46]

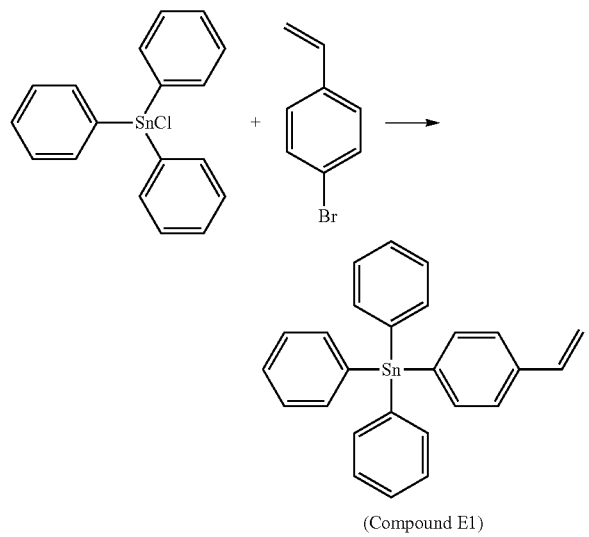

(Compound E1)

1.2 g of magnesium and 6 g of THF are added to a flask from which moisture has been removed in advance. A solution of 6.0 g of 4-vinylbromobenzene dissolved in 12.0 g of THF is added dropwise thereto over 1 hour. After the dropwise addition, the mixture is stirred for 1 hour and the obtained 4-vinylphenylmagnesium bromide solution is added dropwise to another flask containing 7.3 g of triphenyltin chloride and 36 g of THF at 5° C. over 30 minutes. After the dropwise addition, the mixture is stirred for 30 minutes and 600 g of 1% aqueous ammonium chloride solution is added, and then the mixture is further stirred for 10 minutes. Thereafter, THF is evaporated and the residue is extracted with 60 g of toluene. The obtained organic layer is washed three times with 60 g of pure water. Thereafter, the obtained organic layer is concentrated and purified by column chromatography (ethyl acetate/hexane=5/95 (volume ratio)) to obtain 5.6 g of 4-vinylphenyl-triphenyltin (Compound E1).

<Synthesis of Compound E2 Constituting Unit E>

(Synthesis Example 35) Synthesis of
4-isopropenylphenyl-triphenyltin (Compound E2)

[Chem. 47]

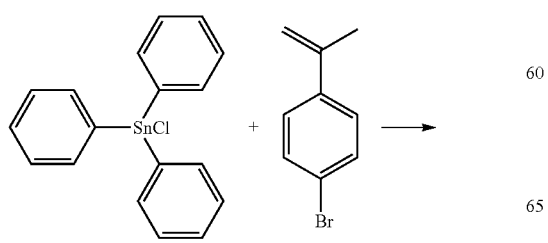

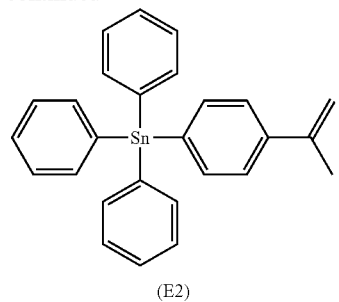

(E2)

7.1 g of 4-isopropenylphenyl-triphenyltin (Compound E2) is obtained in the same procedure as Synthesis Example 34 except that 4-isopropenylbromobenzene is used instead of 4-vinylbromobenzene.

<Synthesis of Compound E3 Constituting Unit E>

(Synthesis Example 36) Synthesis of
4-vinylphenyl-tributyltin (Compound E3)

[Chem. 48]

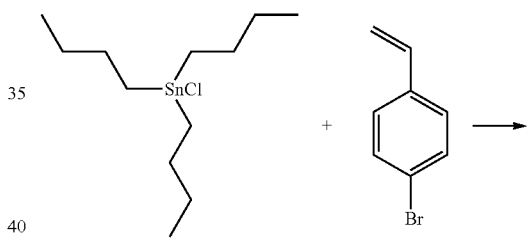

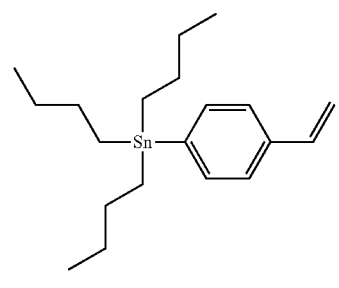

(Compound E3)

5.1 g of 4-vinylphenyl-tributyltin (Compound E3) is obtained in the same procedure as Synthesis Example 34 except that tributyltin chloride is used instead of triphenyltin chloride.

<Synthesis of Compound E4 Constituting Unit E>

(Synthesis Example 37) Synthesis of 4-vinylphenyl-triphenylgermane (Compound E4)

[Chem. 49]

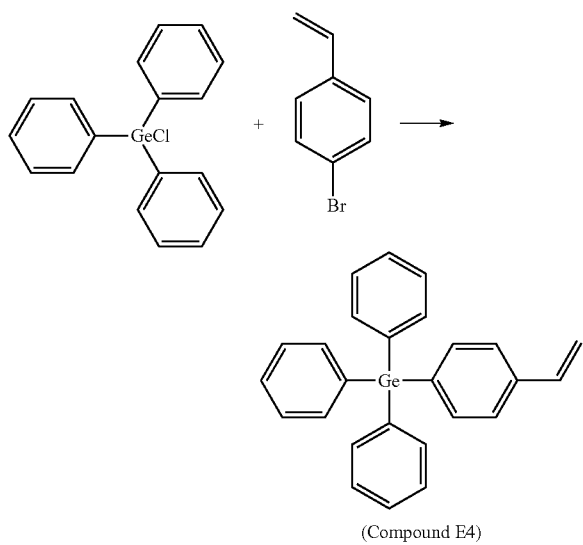

(Compound E4)

3.1 g of 4-vinylphenyl-tributylgermane (Compound E4) is obtained in the same procedure as Synthesis Example 34 except that triphenylgermanium chloride is used instead of triphenyltin chloride.

<Synthesis of Polymer 1>

(Synthesis Example 38) Synthesis of Polymer 1

[Chem. 50]

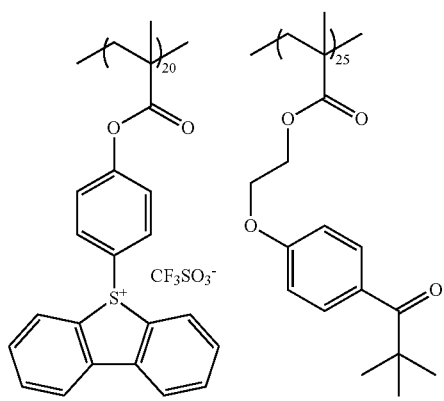

6.9 g of the compound A1 constituting the unit A, 5.1 g of the compound B1 constituting the unit B, 3.0 g of α-methacryloxy-γ-butyrolactone (monomer F1) and 2.8 g of 2-hydroxyethyl methacrylate (Monomer F2) constituting the unit F, 0.81 g of dimethyl-2,2'-azobis(2-methylpropionate) as a polymerization initiator and 0.16 g of 2-mercaptoethanol are dissolved in a mixed solution of 12 g of methanol and 12 g of γ-butyrolactone and deoxygenated. This is added dropwise over 4 hours to a mixed solution of 4 g of γ-butyrolactone and 4 g of methanol which is preheated to 70° C. After dropwise addition, the mixture is stirred for 2 hours and then cooled. After cooling, the mixture is dropwise added to 90 g of diisopropyl ether to reprecipitate. This is filtered and dried under vacuum to obtain 7.4 g of the objective polymer 1.

Although specific unit ratios of polymers are disclosed as above, the polymers of some embodiments of the present invention are not limited thereto.

<Synthesis of Polymers 1 to 19>

(Synthesis Example 39) Synthesis of Polymers 2 to 19

According to the above Synthesis Example 34, Polymers 2 to 19 are synthesized using the compounds A1 to A6 constituting the unit A, the compounds B1 to B6 constituting the unit B, the compound 1 which is a sensitizer compound, the compounds C1 to C2 constituting the sensitizer unit C, the monomer D constituting the unit D, the compounds E1 to E4 constituting the unit E, and F1 to F5 constituting the unit F. Details of each synthesized polymer are described in Table 1.

Monomer D: 4-hydroxyphenyl methacrylate
Monomer F1: α-methacryloxy-γ-butyrolactone
Monomer F2: 2-hydroxyethyl methacrylate
Monomer F3: 4-tert-butoxystyrene
Monomer F4: 2-hydroxyethyl acrylate
Monomer F5: glycidyl methacrylate

TABLE 1

|  | Unit A Composition Ratio (mol %) | Unit B Composition Ratio (mol %) | Unit C Composition Ratio (mol %) | Unit D Composition Ratio (mol %) | Unit E Composition Ratio (mol %) | Unit F Composition Ratio (mol %) | |
|---|---|---|---|---|---|---|---|
| Polymer 1 | Compound A1 20 | Compound B1 25 |  |  |  | Monomer F1 25 | Monomer F2 30 |
| Polymer 2 | Compound A2 20 | Compound B1 25 |  |  |  | Monomer F1 25 | Monomer F2 30 |

TABLE 1-continued

| | Unit A Composition Ratio (mol %) | Unit B Composition Ratio (mol %) | Unit C Composition Ratio (mol %) | Unit D Composition Ratio (mol %) | Unit E Composition Ratio (mol %) | Unit F Composition Ratio (mol %) | | |
|---|---|---|---|---|---|---|---|---|
| Polymer 3 | Compound A3 20 | Compound B1 25 | | | | Monomer F1 25 | Monomer F2 30 | |
| Polymer 4 | Compound A4 20 | Compound B1 25 | | | | Monomer F1 25 | Monomer F2 30 | |
| Polymer 5 | Compound A5 20 | Compound B1 25 | | | | Monomer F1 25 | Monomer F2 30 | |
| Polymer 6 | Compound A6 20 | Compound B1 25 | | | | Monomer F1 25 | Monomer F2 30 | |
| Polymer 7 | Compound A1 20 | Compound B4 25 | | | | Monomer F1 25 | Monomer F2 30 | |
| Polymer 8 | Compound A1 20 | Compound B5 25 | | | | Monomer F1 25 | Monomer F2 30 | |
| Polymer 9 | Compound A1 20 | Compound B6 25 | | | | Monomer F1 25 | Monomer F2 30 | |
| Polymer 10 | Compound A1 20 | Compound B1 25 | | | | Monomer F1 25 | Monomer F2 30 | |
| Polymer 11 | Compound A1 20 | Compound B1 25 | | | | Monomer F1 15 | Monomer F2 30 | Monomer F3 10 |
| Polymer 12 | Compound A1 20 | Compound B1 25 | | Monomer D 10 | | Monomer F1 15 | Monomer F2 30 | |
| Polymer 13 | Compound A1 20 | Compound B1 25 | | | | Monomer F1 25 | Monomer F2 30 | Monomer F5 10 |
| Polymer 14 | Compound A1 20 | Compound B1 25 | Compound C2 10 | | | Monomer F1 25 | Monomer F2 30 | |
| Polymer 15 | Compound A1 20 | Compound B1 25 | Compound C2 10 | | | Monomer F1 25 | Monomer F2 30 | |
| Polymer 16 | Compound A4 20 | Compound B1 25 | Compound C1 10 | | | Monomer F1 15 | Monomer F2 30 | |
| Polymer 17 | Compound A6 20 | Compound B1 25 | | Monomer D 10 | Monomer E1 15 | Monomer F1 15 | Monomer F2 15 | |
| Polymer 18 | Compound A1 40 | | | | | Monomer F1 30 | Monomer F2 30 | |
| Polymer 19 | Compound A1 40 | | | | | Monomer F1 30 | Monomer F2 30 | |

<Preparation of Resist Composition>

400 mg of any of the above polymers is dissolved in a mixed solvent of 4 ml of γ-butyrolactone and 4 ml of cyclohexanone to prepare resist composition samples 1 to 10 of Examples 1 to 8 and Comparative Examples 1 and 2. The polymers used are described in Table 2.

<Preparation of Developer>

A developer modified for each polymer is prepared by mixing pure water, methanol, isopropyl alcohol, acetonitrile, tetrahydrofuran and methyl ethyl ketone, so that 15% by mass of the polymers 1 to 19 is dissolved therein. A content of each component is in the range of 0 to 70% by mass.

<Evaluation of Electron Beam Sensitivity>

The resist composition sample 1 is spin-coated on a silicon wafer modified with hexamethylenedisilazane in advance. This is prebaked on a hot plate at 110° C. for 1 minute to obtain a substrate on which a coating film having a thickness of 200 nm forms. To the coating film on the substrate, a line and space pattern of 2 μm is drawn by an electron beam of 30 keV using an electron beam lithography system (JSM-6500F, JEOL Ltd.). After irradiation with the electron beam, the substrate is developed with the developer for 1 minute and then rinsed with pure water to obtain the line and space pattern of 2 μm. The irradiation dose at this time is defined as $E_{max}$ [μC/cm$^2$], and the sensitivity to the irradiation with the electron beam is evaluated.

The sensitivity evaluation is also performed on Samples 2 to 10 in the same procedure as above. The results are described in Table 2.

TABLE 2

| | Resist Composition Sample | Polymer | Sensitivity ($E_{max}$) [μC/cm$^2$] |
|---|---|---|---|
| Example 1 | Sample 1 | Polymer 1 | 50.0 |
| Example 2 | Sample 2 | Polymer 3 | 50.0 |
| Example 3 | Sample 3 | Polymer 4 | 42.5 |
| Example 4 | Sample 4 | Polymer 7 | 42.5 |
| Example 5 | Sample 5 | Polymer 10 | 45.0 |
| Example 6 | Sample 6 | Polymer 12 | 45.0 |
| Example 7 | Sample 7 | Polymer 13 | 40.0 |
| Example 8 | Sample 8 | Polymer 17 | 37.5 |
| Comparative Example 1 | Sample 9 | Polymer 18 | 120 |
| Comparative Example 2 | Sample 10 | Polymer 19 | 125 |

According to Examples 1 to 3 in Table 2, it is found that when the polarity conversion of the onium salt is utilized, no significant difference in sensitivity is observed regardless of whether compound A1 or compound A3 having different acid strength. On the other hand, when the compound A4 having a hexafluoroantimonate anion is used, since a density of the film is largely increased by including antimony, the sensitivity to the electron beam is improved. This is because the metal atom such as antimony has a greater absorption of the electron beam than organic atoms such as hydrogen, carbon, oxygen and fluorine. Therefore, the same effect can be expected for EUV.

According to the comparison of Examples 1 to 2 and Comparative Examples 1 to 2, it is found that the sensitivity of Examples 1 to 2, having both unit A and unit B, is greatly enhanced from Comparative Examples 1 to 2, not having unit B, because the crosslinking reaction can proceed by using radicals generated at the same time as the polarity conversion of the onium salt. Same as the compound B1, the similar effect can be expected for a polymer containing a unit B which has an α-aminoacetophenone skeleton, a n-acyloxime skeleton and a benzil ketal skeleton having high radical generation efficiency.

According to the comparison of Example 1 and Example 4, it is found that a compound having a spacer structure such as the compound B4 more improves the sensitivity than a compound having no spacer structure such as the compound B1. This is because a molecular having the spacer structure is flexible and easily crosslinks. The spacer structure corresponds to Sp part in the above formulas (III) to (V).

According to the comparison of Example 1 and Example 5, it is found that the monomer having an acrylic group such as the monomer E4 generates radicals in the main chain by irradiation with the electron beam and crosslinks, so that the crosslinking density is increased and the sensitivity of Example 5 becomes higher than that of Example 1. Styrene and the like are also crosslinked in the same way, so that they are also expected to improve the sensitivity.

According to the comparison of Example 1 and Example 6, it is seemed that a monomer having a phenoxy group such as monomer D traps a radical generated by irradiation with the electron beam to generate a more stable phenoxy radical. It is found that the stable radical having a long lifetime is generated, so that the efficiency of crosslinking by a recombination reaction of the radical increases and the sensitivity is enhanced. The similar effect is expected for hindered amines.

According to the comparison of Example 1 and Example 7, it is seemed that a monomer having a glycidyl group such as the monomer F5 causes a cationic polymerization by the acid generated from the onium salt decomposed by irradiation with the electron beam, so that the crosslinking density is increased and the sensitivity becomes higher. When an onium salt which generates a strong acid by the decomposition such as compound A1 is used, higher sensitivity is expected by having a cation-polymerizable functional group.

According to the comparison of Example 6 and Example 8, a monomer having tin such as the monomer E1 has higher sensitivity to the electron beam because the density of the film increases. Furthermore, it is seemed that crosslinking of the active species generated by decomposition of the radical cation from the aryltin increases the crosslinking density and improves the sensitivity. Since metal atoms such as tin and antimony absorb more electron beam than atoms such as hydrogen, carbon, oxygen and fluorine, the same effect can be expected for EUV.

<Evaluation of Photosensitization>

A line and space pattern of 2 μm is drawn with the electron beam in the same procedure as the Evaluation of Electron Beam Sensitivity. Then, the entire surface of the taken wafer is irradiated in a vacuum with 100 mJ/cm² of a black light (FL8BL, manufactured by Hitachi Appliances Co., Ltd.) having an exposure wavelength of 365 nm±5 nm using a band pass filter. After the UV irradiation, the substrate is developed with the developer for 1 minute and then rinsed with pure water to obtain a line and space pattern of 2 μm. The irradiation dose at this time is defined as $E_{max}$ [μC/cm²], and the sensitivity to the electron beam irradiation is evaluated. The results are described in Table 3.

TABLE 3

| | Composition | | Sensitivity ($E_{max}$) [μC/cm²] |
|---|---|---|---|
| Example 9 | Polymer 2 | Compound 1 | 47.5 |
| Example 10 | Polymer 14 (Including Compound C2 as a monomer) | | 45.0 |
| Example 11 | Polymer 15 (Including Compound C1 as a monomer) | | 42.5 |
| Example 12 | Polymer 2 | | 55.0 |
| Example 13 | Polymer 16 (Including Compound C1 as a monomer) | | 60.0 |

According to the comparison of Example 9 and Example 12 in Table 3, it is seemed that sensitivity is improved by adding Compound 1 to the resist composition and performing UV irradiation after the exposure of electron beam. It is believed that this is because Compound 1 reduces the onium salt with the electron beam irradiation and generates 2,2',4,4'-tetramethoxybenzophenone, then 2,2',4,4'-tetramethoxybenzophenone reduces the sulfonium salt with UV irradiation.

Example 10 uses a monomer as a monomer constituting the unit C of the polymer, the monomer is to be a benzophenone derivative with decomposition of an acid dissociable group of the monomer by an acid generated by decomposition of the onium salt upon the electron beam irradiation. Accordingly, it is considered that, same as Example 9, the benzophenone derivative reduces the sulfonium salt with UV irradiation, so the sensitivity is enhanced.

The sensitivity of Example 11 is higher than that of Example 9. Comprising a benzhydrol derivative as the unit C in the polymer causes hydrogen abstraction by radicals generated with the electron beam irradiation, and generates a ketyl radical. Since the ketyl radical has a long lifetime, even though it does not reduce the sulfonium salt, the ketyl radical is crosslinked by recombination reaction, which is thought to be a reason for high sensitivity.

It is found that the sensitivity of Example 13 is also improved by UV irradiation.

INDUSTRIAL APPLICABILITY

Some aspects of the present invention provide a polymer used for a resist composition having high absorption efficiency for particle beam or electromagnetic wave such as EUV, excellence in sensitivity, resolution and pattern performance characteristics, and provide a resist composition containing the polymer.

The invention claimed is:
1. A polymer, comprising:
a unit A; and
a unit B,
wherein: the unit A has an onium salt structure and generates a first radical by irradiation with a particle beam or an electromagnetic wave;
the unit B has a radical generating structure containing at least one multiple bond selected from the group consisting of: a multiple bond between a carbon atom and a carbon atom; and a multiple bond between a carbon atom and a heteroatom;
the unit B generates a second radical by irradiation with a particle beam or an electromagnetic wave;
the multiple bond in the radical generating structure is not a multiple bond contained in a benzenoid aromatic;

the polymer does not comprise a unit having an acid dissociable group whose solubility in a water-soluble developer is enhanced by an acid; and the unit B is represented by at least one of following general formulas (III) to (V),

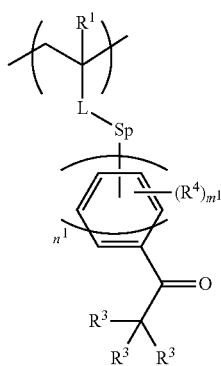
(III)

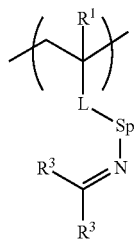
(IV)

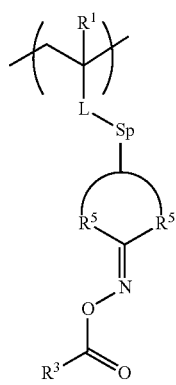
(V)

wherein, in the general formulas (III) to (V), $R^1$ is any one selected from the group consisting of:

a hydrogen atom;

a linear, branched or cyclic alkyl group having 1 to 6 carbon atoms; and a linear, branched or cyclic alkenyl group having 1 to 6 carbon atoms, and where at least one hydrogen atom in the alkyl group and the alkenyl group in $R^1$ may be substituted with a fluorine atom;

L is any one selected from the group consisting of: a carbonyloxy group, a phenylenediyl group, a naphthalenediyl group, a phenylenediyloxy group, a naphthalenediyloxy group, a phenylenediylcarbonyloxy group, a naphthalenediylcarbonyloxy group, a phenylenediyloxycarbonyl group and a naphthalenediyloxycarbonyl group;

Sp is any one selected from the group consisting of:

a direct bond;

a linear, branched or cyclic alkylene group which may have a substituent, the alkylene group having 1 to 6 carbon atoms; and a linear, branched or cyclic alkenylene group which may have a substituent, the alkenylene group having 1 to 6 carbon atoms, and where at least one methylene group in the Sp may be substituted with a divalent heteroatom-containing group;

each $R^3$ is independently any one selected from the group consisting of:

a hydrogen atom;

a hydroxy group;

—$R^a$, where $R^a$ is a linear, branched or cyclic alkyl group which may have a substituent, the alkyl group having 1 to 12 carbon atoms, and at least one methylene group in $R^a$ may be substituted with a divalent heteroatom-containing group;

—$OR^a$;

a group where at least one carbon-carbon single bond in $R^a$ is substituted with a carbon-carbon double bond; and —$R^b$, where $R^b$ is an aryl group which may have a substituent, the aryl group having 6 to 14 carbon atoms, or $R^b$ is a heteroaryl group which may have a substituent, the heteroaryl group having 4 to 12 carbon atoms, where two of $R^3$ may form a ring structure with each other through a direct single bond, or any one selected from the group consisting of an oxygen atom, a sulfur atom and a methylene group;

$R^4$ is any one selected from the group consisting of: —$R^a$; —$R^b$; —$OR^a$; —$SR^a$; —$OR^b$; —$SR^b$; —$OC(=O)R^a$; —$OC(=O)R^b$; —$C(=O)OR^a$; —$C(=O)OR^b$; —$OC(=O)OR^a$; —$OC(=O)OR^b$; —$NHC(=O)R^a$; —$NR^aC(=O)R^a$; —$NHC(=O)R^b$; —$NR^bC(=O)R^b$; —$NR^aC(=O)R^b$; —$NR^bC(=O)R^a$; —$N(R^a)_2$; —$N(R^b)_2$; —$N(R^a)(R^b)$; —$SO_3R^a$; —$SO_3R^b$; —$SO_2R^a$; —$SO_2R^b$; a group where at least one carbon-carbon single bond in $R^a$ is substituted with a carbon-carbon double bond; and a nitro group, $n^1$ is an integer of 1 to 3, $m^1$ is an integer of 0 to 4 when $n^1$ is 1, $m^1$ is an integer of 0 to 6 when $n^1$ is 2, and $m^1$ is 0 to 8 when $n^1$ is 3; and $R^5$ is any one selected from the group consisting of:

a linear, branched or cyclic alkylene group which may have a substituent, the alkylene group having 1 to 12 carbon atoms;

a linear, branched or cyclic alkyleneoxy group which may have a substituent, the alkyleneoxy group having 1 to 12 carbon atoms;

a linear, branched or cyclic alkenylene group which may have a substituent, the alkenylene group having 1 to 12 carbon atoms;

a linear, branched or cyclic alkenyleneoxy group which may have a substituent, the alkenyleneoxy group having 1 to 12 carbon atoms;

an arylene group which may have a substituent, the arylene group having 6 to 14 carbon atoms; and a heteroarylene group which may have a substituent, the heteroarylene group having 4 to 12 carbon atoms, and where at least one methylene group in $R^5$ may be substituted with a divalent heteroatom-containing group.

2. The polymer of claim 1, wherein the unit A is represented by a following general formula (I),

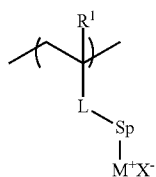
(I)

wherein, in the general formula (I), $M^+$ is a sulfonium ion or an iodonium ion, $X^-$ is a monovalent anion, L is any one selected from the group consisting of: a carbonyloxy group, a phenylenediyl group, a naphthalenediyl group, a phenylenediyloxy group, a naphthalenediyloxy group, a phenylenediylcarbonyloxy group, a naphthalenediylcarbonyloxy group, a phenylenediyloxycarbonyl group and a naphthalenediyloxycarbonyl group, Sp is any one selected from the group consisting of:
a direct bond;
a linear, branched or cyclic alkylene group which may have a substituent, the alkylene group having 1 to 6 carbon atoms; and
a linear, branched or cyclic alkenylene group which may have a substituent, the alkenylene group having 1 to 6 carbon atoms, and
where at least one methylene group in the Sp may be substituted with a divalent heteroatom-containing group, and $R^1$ is any one selected from the group consisting of:
a hydrogen atom;
a linear, branched or cyclic alkyl group having 1 to 6 carbon atoms; and
a linear, branched or cyclic alkenyl group having 1 to 6 carbon atoms, and
where at least one hydrogen atom in the alkyl group and the alkenyl group in $R^1$ may be substituted with a fluorine atom.

3. The polymer of claim 2, wherein the unit A is represented by a following formula (II),

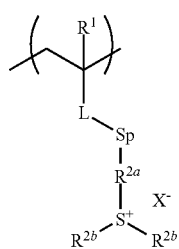
(II)

wherein, in the general formula (II), $R^1$, L, Sp and $X^-$ are the same as those in the general formula (I), $R^{2a}$ is any one selected from the group consisting of:
a linear, branched or cyclic alkylene group which may have a substituent, the alkylene group having 1 to 6 carbon atoms;
a linear, branched or cyclic alkenylene group which may have a substituent, the alkenylene group having 1 to 6 carbon atoms;
an arylene group which may have a substituent, the arylene group having 6 to 14 carbon atoms;
a heteroarylene group which may have a substituent, the heteroarylene group having 4 to 12 carbon atoms; and a direct bond, and
where at least one methylene group in $R^{2a}$ may be substituted with a divalent heteroatom-containing group, and
each of $R^{2b}$ is independently any one selected from the group consisting of:
a linear, branched or cyclic alkyl group which may have a substituent, the alkyl group having 1 to 6 carbon atoms;
a linear, branched or cyclic alkenyl group which may have a substituent, the alkenyl group having 1 to 6 carbon atoms;
an aryl group which may have a substituent, the aryl group having 6 to 14 carbon atoms; and
a heteroaryl group which may have a substituent, the heteroaryl group having 4 to 12 carbon atoms, and
where at least one methylene group in $R^{2b}$ may be substituted with a divalent heteroatom-containing group, and two selected from $R^{2a}$ and two of $R^{2b}$ may form a ring structure with each other through a direct single bond, or any one selected from the group consisting of an oxygen atom, a sulfur atom and a methylene group.

4. The polymer of claim 2, wherein $X^-$ is any one selected from the group consisting of an anion A and an anion B;
where the anion A is any one selected from the group consisting of an alkyl sulfonate anion, an aryl sulfonate anion, an alkyl carboxylate anion, an aryl carboxylate anion, a tetrafluoroborate anion, a hexafluorophosphonate anion, a dialkylsulfonylimide anion, a trialkylsulfonatemethide anion, a tetrakisphenylborate anion, hexafluoroantimonate and a monovalent metal oxonium anion;
the anion B is a hydrogen acid anion containing the anion A; and
at least one hydrogen atom of the alkyl group and the aryl group in $X^-$ may be substituted with a fluorine atom.

5. The polymer of claim 1, wherein the unit B is represented by at least one of the following general formulas (III) and (V).

6. The polymer of claim 1, further comprising a unit C, wherein the unit C includes a compound represented by following general formulas (VI) to (VIII) bonding to an Sp group of formula (1),

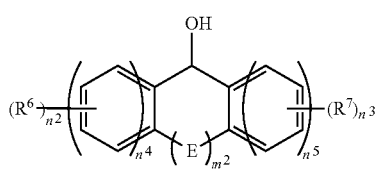
(VI)

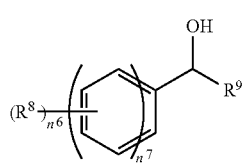
(VII)

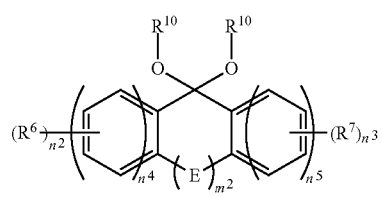
(VIII)

wherein, in the general formulas (VI) to (VIII),
each of $R^6$, $R^7$ and $R^8$ is independently any one selected from the group consisting of:
a hydrogen atom; an electron donating group; and an electron withdrawing group, and
where at least one of $R^6$ and $R^7$ is the electron donating group, and at least one of $R^8$ is the electron donating group,
$R^9$ is any one selected from the group consisting of: a hydrogen atom; an alkyl group which may have a substituent; and an alkenyl group which may have a substituent,
where at least one methylene group in $R^9$ may be substituted with a divalent heteroatom-containing group,
each of $R^{10}$ is independently any one selected from the group consisting of: a hydrogen atom; an alkyl group which may have a substituent; and an alkenyl group which may have a substituent,
where two of $R^{10}$ may bond each other to form a ring structure,
E is any one selected from the group consisting of a direct bond, an oxygen atom, a sulfur atom and a methylene group,
$m^2$ is an integer of 0 or 1,
$n^4$ and $n^5$ are each an integer of 0 to 2, where $n^4+n^5$ is 2,
$n^2$ is an integer of 0 to 4 when $n^4$ is 1, and $n^2$ is an integer of 0 to 6 when $n^4$ is 2,
$n^3$ is an integer of 0 to 4 when $n^5$ is 1, and $n^3$ is an integer of 0 to 6 when $n^5$ is 2,
$n^6$ is an integer of 0 to 7, and
$n^7$ is 1 or 2, $n^6$ is an integer of 0 to 5 when $n^7$ is 1, and $n^6$ is an integer of 0 to 7 when $n^7$ is 2,
wherein formula (1) is:

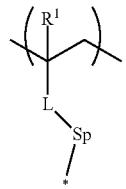

(1)

wherein, $R^1$ is any one selected from the group consisting of:
a hydrogen atom;
a linear, branched or cyclic alkyl group having 1 to 6 carbon atoms; and
a linear, branched or cyclic alkenyl group having 1 to 6 carbon atoms, and
where at least one hydrogen atom in the alkyl group and the alkenyl group in $R^1$ may be substituted with a fluorine atom,
L is any one selected from the group consisting of: a carbonyloxy group, a phenylenediyl group, a naphthalenediyl group, a phenylenediyloxy group, a naphthalenediyloxy group, a phenylenediylcarbonyloxy group, a naphthalenediylcarbonyloxy group, a phenylenediyloxycarbonyl group and a naphthalenediyloxycarbonyl group,
Sp is any one selected from the group consisting of:
a direct bond;
a linear, branched or cyclic alkylene group which may have a substituent, the alkylene group having 1 to 6 carbon atoms; and
a linear, branched or cyclic alkenylene group which may have a substituent, the alkenylene group having 1 to 6 carbon atoms, and
where at least one methylene group in the Sp may be substituted with a divalent heteroatom-containing group, and
* represents a bonding site with the compound represented by the general formulas (VI) to (VIII).

7. The polymer of claim 1, further comprising a unit D having a radical scavenger structure.

8. The polymer of claim 1, further comprising an organometallic compound-containing unit E having a metal atom selected from the group consisting of: Sn, Sb, Ge, Bi and Te.

9. A resist composition comprising the polymer of claim 1.

10. The resist composition of claim 9, further comprising a compound represented by any one of following general formulas (VI) to (VIII),

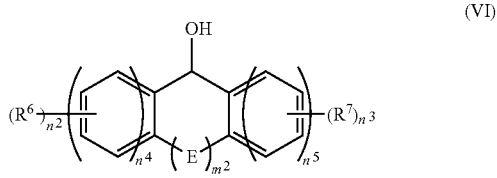

(VI)

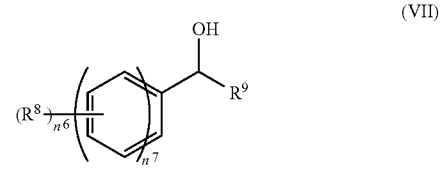

(VII)

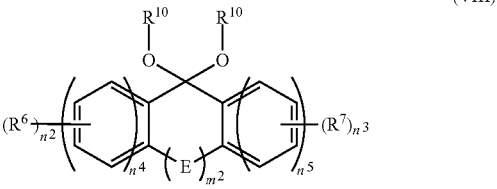

(VIII)

wherein, in the general formulas (VI) to (VIII),
$m^2$ is an integer of 0 or 1,
$n^4$ and $n^5$ are each an integer of 0 to 2, where $n^4+n^5$ is 2,
$n^2$ is an integer of 0 to 4 when $n^4$ is 1, and $n^2$ is an integer of 0 to 6 when $n^4$ is 2,
$n^3$ is an integer of 0 to 4 when $n^5$ is 1, and $n^3$ is an integer of 0 to 6 when $n^5$ is 2,
$n^6$ is an integer of 0 to 7, and
$n^7$ is 1 or 2, $n^6$ is an integer of 0 to 5 when $n^7$ is 1, and $n^6$ is an integer of 0 to 7 when $n^7$ is 2,
when any of $R^6$, $R^7$ and $R^8$ are present, each of $R^6$, $R^7$ and $R^8$ is independently selected from the group consisting of: a hydrogen atom; an electron donating group; and an electron withdrawing group,
when more than one $R^6$ is present, at least one $R^6$ is the electron donating group, when more than one $R^7$ is present, at least one $R^7$ is the electron donating group, and when more than one $R^8$ is present, at least one of $R^8$ is the electron donating group,
$R^9$ is any one selected from the group consisting of: a hydrogen atom; an alkyl group which may have a substituent; and an alkenyl group which may have a substituent, and at least one methylene group in $R^9$ may be substituted with a divalent heteroatom-containing group, each of $R^{10}$ is independently any one selected from the group consisting of: a hydrogen atom; an alkyl group which may have a substituent; and an alkenyl group which may have a substituent, and two of $R^{10}$ may bond each other to form a ring structure, and when E is present, E is any one selected from the group consisting of a direct bond, an oxygen atom, a sulfur atom and a methylene group.

11. The resist composition of claim 9, further comprising at least one of an organometallic compound or an organometallic complex, wherein a metal of the organometallic compound and the organometallic complex is at least one selected from the group consisting of: Al, Cr, Mn, Fe, Co, Ni, Cu, Zn, Ga, Ge, Rh, Pd, Ag, Cd, In, Sn, Sb, Te, I, Xe, Hf, Ta, W, Re, Os, Ir, Pt, Au, Hg, Tl, Pb, Bi, Po, At, Rn and Ra.

12. A method for manufacturing a device, comprising:

a resist film forming step of forming the resist film on a substrate using the resist composition of claim 9;

a photolithography step of exposing the resist film to a particle beam or an electromagnetic wave; and a pattern forming step of developing the exposed resist film to obtain a photoresist pattern.

13. The method of claim 12, wherein the particle beam is an electron beam, and the electromagnetic wave is an extreme ultraviolet radiation.

\* \* \* \* \*